US007570072B2

(12) United States Patent
Hata et al.

(10) Patent No.: US 7,570,072 B2
(45) Date of Patent: Aug. 4, 2009

(54) DISPLAY DEVICE INCLUDING TEST CIRCUIT AND ELECTRONIC APPARATUS HAVING THE DISPLAY DEVICE

(75) Inventors: Yuki Hata, Kanagawa (JP); Tomoyuki Iwabuchi, Yokosuka (JP); Akihiro Kimura, Kanagawa (JP); Shuhei Nagatsuka, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 11/669,399

(22) Filed: Jan. 31, 2007

(65) Prior Publication Data

US 2007/0182442 A1 Aug. 9, 2007

(30) Foreign Application Priority Data

Feb. 3, 2006 (JP) ............................ 2006-026761

(51) Int. Cl.
*G01R 31/00* (2006.01)

(52) U.S. Cl. ........................................ 324/770; 345/87

(58) Field of Classification Search ................. 324/770, 324/158.1; 345/87
See application file for complete search history.

(56) References Cited

U.S. PATENT DOCUMENTS

| | | | | |
|---|---|---|---|---|
| 5,453,991 | A * | 9/1995 | Suzuki et al. | 714/724 |
| 5,506,516 | A * | 4/1996 | Yamashita et al. | 324/770 |
| 5,576,730 | A * | 11/1996 | Shimada et al. | 345/98 |
| 5,852,429 | A * | 12/1998 | Scheffer et al. | 345/100 |
| 6,239,779 | B1 * | 5/2001 | Furuya et al. | 345/87 |
| 7,145,358 | B2 * | 12/2006 | Ando | 324/770 |
| 2003/0098708 | A1 * | 5/2003 | Matsueda | 324/770 |
| 2003/0151587 | A1 * | 8/2003 | Yamashita | 345/102 |
| 2005/0200377 | A1 * | 9/2005 | Orii et al. | 324/770 |
| 2006/0226866 | A1 * | 10/2006 | Ando | 324/770 |
| 2007/0018680 | A1 * | 1/2007 | Jeon et al. | 324/770 |

FOREIGN PATENT DOCUMENTS

| | | |
|---|---|---|
| JP | 2002-221547 | 8/2002 |

* cited by examiner

*Primary Examiner*—Ha Tran T Nguyen
*Assistant Examiner*—Richard Isla Rodas
(74) *Attorney, Agent, or Firm*—Fish & Richardson P.C.

(57) ABSTRACT

To provide a display device having a test circuit with high accuracy for testing in the step after a counter substrate is attached and before shipping, and to provide a display device having a correction circuit inside the display device, for the case where a defect occurs. A pixel circuit operated by a gate line and a source line, a first wiring formed at the same time as the gate line, a second wiring formed at the same time as the source line, and a test circuit of detecting a defect of the pixel circuit by using potentials of the first wiring and the second wiring are provided over a substrate.

11 Claims, 25 Drawing Sheets

DISPLAY DEVICE INCLUDING TEST CIRCUIT AND ELECTRONIC APPARATUS HAVING THE DISPLAY DEVICE

BACKGROUND OF THE INVENTION

1. Field of the Invention

The present invention relates to a display device. In particular, the present invention relates to a display device having a test circuit for simplifying testing of the display device and improving reliability, and improving a shipping yield. Further, the present invention relates to a display device having a test circuit, and relates to a correction circuit for correcting a signal which is inputted to the display device having a defect detected by the test circuit.

2. Description of the Related Art

In recent years, demand for thin displays as application mainly to TVs, PC monitors, mobile terminals, and the like has increased rapidly and further development thereof has been promoted. The thin displays include a display device using a liquid crystal element (Liquid Crystal Display: LCD) and a display device having a light-emitting element.

As an example of a display device using a light-emitting element or a liquid crystal element, an active matrix display device shown in FIG. 20 can be given.

The display device shown in FIG. 20 includes a gate signal line driver circuit 2001, a source signal line driver circuit 2002, a pixel portion 2003, and a connection terminal portion 2005 where a plurality of connection terminals 2004 are formed, over a substrate 2000. A gate line 2006 is connected to the gate signal line driver circuit 2001, while a source line 2007 is connected to the source signal line driver circuit 2002. A pixel 2008 in the pixel portion 2003 is connected to the gate line 2006, the source line 2007, and a power source line 2009. In the pixel 2008, a transistor for writing a signal from the source line 2007 to a light-emitting element or a liquid crystal element provided in the pixel, by a signal of the gate line 2006 is provided. Terminals of the transistor are connected to the gate line 2006 and the source line 2007 respectively in each pixel. Further, an FPC (Flexible Printed Circuit, which is not shown) for inputting an external signal is connected to the connection terminal portion 2005. The substrate 2000 is completed as a display module by being attached a counter substrate 2010 for sealing the light-emitting elements or the liquid crystal elements provided in the pixels 2008.

In FIG. 20, in the case of performing display in the pixel portion, providing that a Low potential of the gate line 2006 is ground, it is preferable that a Low potential of the source line 2007 be higher than the Low potential of the gate line 2006 and a difference between the Low potential of the source line 2007 and the Low potential of the gate line 2006 be equal to or higher than the threshold voltage (Vth) of the transistor for writing connected to the gate line 2006. In the case where the Low potential of the source line 2007 is lower than the Low potential of the gate line 2006 and the difference between the Low potential of the source line 2007 and the Low potential of the gate line 2006 is less than the threshold voltage (Vth) of the transistor for writing, current easily leaks from the transistor for writing so that the display device cannot perform normal display.

Note that a High potential and a Low potential of the source line and the gate line mean a relatively high potential and a relatively low potential respectively; the High potential and the Low potential may be determined so as to have a predetermined potential difference therebetween such that the High potential is a value for turning the transistor on whereas the Low potential is a value for turning the transistor off.

In the display device using the liquid crystal element or the light-emitting element shown in FIG. 20, the pixel is driven by a potential relationship between signals from the gate signal line driver circuit and the source signal line driver circuit. Therefore, it is preferable that a defect of the display device, such as that the above-described potentials cannot be held, can be detected by testing the potentials of the signals from the gate signal line driver circuit and the source signal line driver circuit.

Therefore, in the display device using the light-emitting element or the liquid crystal element, in order to perform testing for a defect of the display device, a sample in modules which had been once completed as shown in FIG. 21A has been tested using a probe 2101 of a measuring instrument after a counter substrate has been removed as shown in FIG. 21B, or testing by using a probe of an measuring instrument has been performed before a counter substrate has been attached (e.g., Reference 1: Japanese Published Patent Application No. 2002-221547)

SUMMARY OF THE INVENTION

In a conventional display device using a liquid crystal element or a light-emitting element, a portion from a gate signal line driver circuit and a source signal line driver circuit to pixels is located within a sealed region of the display device. Therefore, testing with each counter substrate of all display modules removed after a manufacturing process or testing of a potential relationship after a step of attaching the counter substrate has been extremely difficult, and defect detection in a period from a step of attaching the counter substrate to shipping has not been sufficiently performed.

In addition, in the case of the method described in Reference 1, when a defect has been detected after a manufacturing process, adverse effect such as that a shipping yield might have been reduced because the defect has not been able to be repaired, manufacturing cost has been increased because the defect has been improved by an external component, or the like has occurred.

Further, with a source line and a gate line led to a connection terminal portion simply by a wiring, there is also a case where testing is performed at a step after a counter substrate is attached, by measuring the potential of the connection terminal portion. The testing has been, however, insufficient because a factor such as a voltage drop by parasitic capacitance, delay, or the like caused by the lead wiring has been contained.

In view of the foregoing, it is an object of the present invention to provide a display device having a test circuit with high accuracy for testing in the process after a counter substrate is attached and before shipping. Further, it is another object of the present invention to provide a display device having a correction circuit inside the display device, for the case where a defect occurs.

For solving the above-described problems, the present invention is provided with a test circuit for distinguishing a defect of a pixel portion. Further, a signal outputted from the test circuit is outputted to a connection terminal through a wiring. Further, the present invention is provided with a correction circuit for correcting the defect of the pixel portion by using the signal outputted from the test circuit. Specific structures of the present invention will be described below.

In accordance with one feature of a display device of the present invention, the following are included: a gate line, a source line, a pixel portion driven by potentials of the gate line and the source line, a first wiring disposed in parallel with the gate line, a second wiring disposed in parallel with the source line, and a test circuit connected to the first wiring and the second wiring, in which the test circuit outputs a signal for distinguishing a defect of the pixel portion by using potentials of the first wiring and the second wiring.

In accordance with another feature of the display device of the present invention, the following are included: a gate line, a source line, a pixel portion driven by potentials of the gate line and the source line, a first wiring disposed in parallel with the gate line, a second wiring disposed in parallel with the source line, a test circuit connected to the first wiring and the second wiring, and a first connection terminal and a second connection terminal connected to the test circuit, in which: the test circuit includes a first circuit connected to the first wiring and the second wiring, a second circuit connected to the second wiring, and a third circuit connected to the first wiring and the second circuit; and the first circuit compares a potential of the first wiring and a potential of the second wiring and outputs a first potential to the first connection terminal when the potential of the second wiring is lower than the potential of the first wiring, the second circuit inputs a second potential which is obtained by subtracting a reference potential from the potential of the second wiring to the third circuit, and the third circuit compares the potential of the first wiring and the second potential and outputs a third potential to the second connection terminal when the second potential is lower than the potential of the first wiring.

In accordance with another feature of the display device of the present invention, the following are included: a gate line, a source line, a pixel portion driven by potentials of the gate line and the source line, a first wiring disposed in parallel with the gate line, a second wiring disposed in parallel with the source line, a test circuit connected to the first wiring and the second wiring, a correction circuit connected to the test circuit, and a first connection terminal and a second connection terminal connected to the test circuit, in which: the test circuit includes a first circuit connected to the first wiring and the second wiring, a second circuit connected to the second wiring, and a third circuit connected to the first wiring and the second circuit; the first circuit compares a potential of the first wiring and a potential of the second wiring and outputs a first potential to the first connection terminal when the potential of the second wiring is lower than the potential of the first wiring, the second circuit inputs a second potential which is obtained by subtracting a reference potential from the potential of the second wiring to the third circuit, and the third circuit compares the potential of the first wiring and the second potential and outputs a third potential to the second connection terminal when the second potential is lower than the potential of the first wiring; and the correction circuit makes the potential of the second wiring higher than the potential of the first wiring in the case where the third potential is outputted to the second connection terminal, thereby correcting the potentials outputted to the first connection terminal and the second connection terminal.

In accordance with another feature of the display device of the present invention, the following are included: a gate line, a source line, a driver circuit for supplying a signal to the source line, a pixel portion driven by potentials of the gate line and the source line, a switching circuit connected to the gate line and the source line, and a test circuit, in which: the switching circuit connects the gate line and the source line to the test circuit when a signal for controlling writing of the source line is not supplied to the driver circuit; and the test circuit outputs a signal for distinguishing a defect of the pixel portion by using the inputted potentials of the gate line and the source line.

In accordance with another feature of the display device of the present invention, the following are included: a gate line, a source line, a driver circuit for supplying a signal to the source line, a pixel portion driven by potentials of the gate line and the source line, a switching circuit connected to the gate line and the source line, a test circuit, and a first connection terminal and a second connection terminal connected to the test circuit, in which: the test circuit includes a first circuit connected to the gate line and the source line, a second circuit connected to the source line, and a third circuit connected to the gate line and the second circuit; the switching circuit connects the gate line and the source line to the test circuit when a signal for controlling writing of the source line is not supplied to the driver circuit; and the first circuit compares an inputted potential of the gate line and an inputted potential of the source line and outputs a first potential to the first connection terminal when the inputted potential of the source line is lower than the inputted potential of the gate line, the second circuit inputs a second potential which is obtained by subtracting a reference potential from the inputted potential of the source line to the third circuit, and the third circuit compares the inputted potential of the gate line and the second potential and outputs a third potential to the second connection terminal when the second potential is lower than the potential of the gate line.

In accordance with another feature of the display device of the present invention, the following are included: a gate line, a source line, a driver circuit for supplying a signal to the source line, a pixel portion driven by potentials of the gate line and the source line, a switching circuit connected to the gate line and the source line, a test circuit, a first connection terminal and a second connection terminal connected to the test circuit, and a correction circuit connected to the test circuit and the second connection terminal, in which: the test circuit includes a first circuit connected to the gate line and the source line, a second circuit connected to the source line, and a third circuit connected to the gate line and the second circuit; the switching circuit connects the gate line and the source line to the test circuit when a signal for controlling writing of the source line is not supplied to the driver circuit; the first circuit compares an inputted potential of the gate line and an inputted potential of the source line and outputs a first potential to the first connection terminal when the inputted potential of the source line is lower than the inputted potential of the gate line, the second circuit inputs a second potential which is obtained by subtracting a reference potential from the inputted potential of the source line to the third circuit, and the third circuit compares the inputted potential of the gate line and the second potential and outputs a third potential to the second connection terminal when the second potential is lower than the potential of the gate line; and the correction circuit makes the potential of the source line higher than the potential of the gate line when the third potential is outputted to the second connection terminal, thereby correcting the potentials outputted to the first connection terminal and the second connection terminal.

Further, in the present invention, the first connection terminal and the second connection terminal may be provided outside a region sealed by a substrate provided with the pixel portion and a counter substrate.

Further, in the present invention, the pixel portion may have a configuration in which a transistor connected to the gate line and the source line is provided, the transistor is selected by a signal inputted to the gate line, and the signal from the source line is written.

Further, in the present invention, the transistor may be an n-channel transistor.

In addition, in accordance with another feature of the present invention, an electronic apparatus has the display device described in this specification in a display portion.

The display device of the present invention includes in its category, a liquid-crystal display device, a DMD (Digital Micromirror Device), a PDP (Plasma Display Panel), an FED (Field Emission Display), and a display device which performs display by using signals inputted to a gate line and a source line, in addition to a display device provided with a light-emitting element typified by an organic light-emitting diode (OLED) for each pixel.

In addition, the light-emitting element in this specification includes in its category an element of which luminance is controlled by a current or a voltage; specifically, an OLED (Organic Light Emitting Diode), inorganic EL (Electro Luminescence), an MIM type electron source element (electron-emitting element) used in an FED (Field Emission Display), and the like are included.

In addition, the display device includes a panel with a light-emitting element sealed, and a module where an IC and the like including a controller are mounted on the panel. Further, the display device includes a panel with a liquid crystal element sealed, and a module where an IC and the like including a controller are mounted on the panel.

As a transistor used in the display device of the present invention, a thin film transistor using a polycrystalline semiconductor, a microcrystalline semiconductor (including a semi-amorphous semiconductor), or an amorphous semiconductor can be used; however, the transistor used in the display device of the present invention is not limited to a thin film transistor. A transistor using single crystalline silicon or a transistor employing an SOI may be used. Alternatively, a transistor using an organic semiconductor, a transistor using a carbon nanotube, or a transistor using zinc oxide may be used. Furthermore, a transistor provided in a pixel of the display device of the present invention may have a single-gate structure, a double-gate structure, or a multi-gate structure having three or more gates.

By the present invention, a structure in which a test circuit is provided is formed so that testing of a display device, which has been implemented only either in a step before a counter substrate is attached or by removing a counter substrate after the counter substrate is attached, can be implemented in an arbitrary step. Therefore, even in a step after a counter substrate is attached, a display defect of the display device caused by a relationship between potentials of a gate line and a source line can be detected.

Further, by the present invention, a structure in which a correction circuit is provided is formed in addition to the structure in which the test circuit is provided. Therefore, the display device of the present invention can correct by itself the display defect of the display device caused by the relationship between the potentials of the gate line and the source line, based on a signal for distinguishing a defect, outputted from the test circuit. Accordingly, testing and correction of the display device can be performed surely, thereby a shipping yield can be improved.

DETAILED DESCRIPTION OF THE INVENTION

Although the present invention will be fully described by way of embodiment modes and embodiments with reference to the accompanying drawings, it is to be understood that various changes and modifications will be apparent to those skilled in the art. Therefore, unless such changes and modifications depart from the scope of the invention, they should be construed as being included therein. Note that throughout the drawings for describing Embodiment Modes and Embodiments, the same portions or portions having the same functions are denoted by the same reference symbols, and description thereof is not repeated.

Embodiment Mode 1

Figure 1:
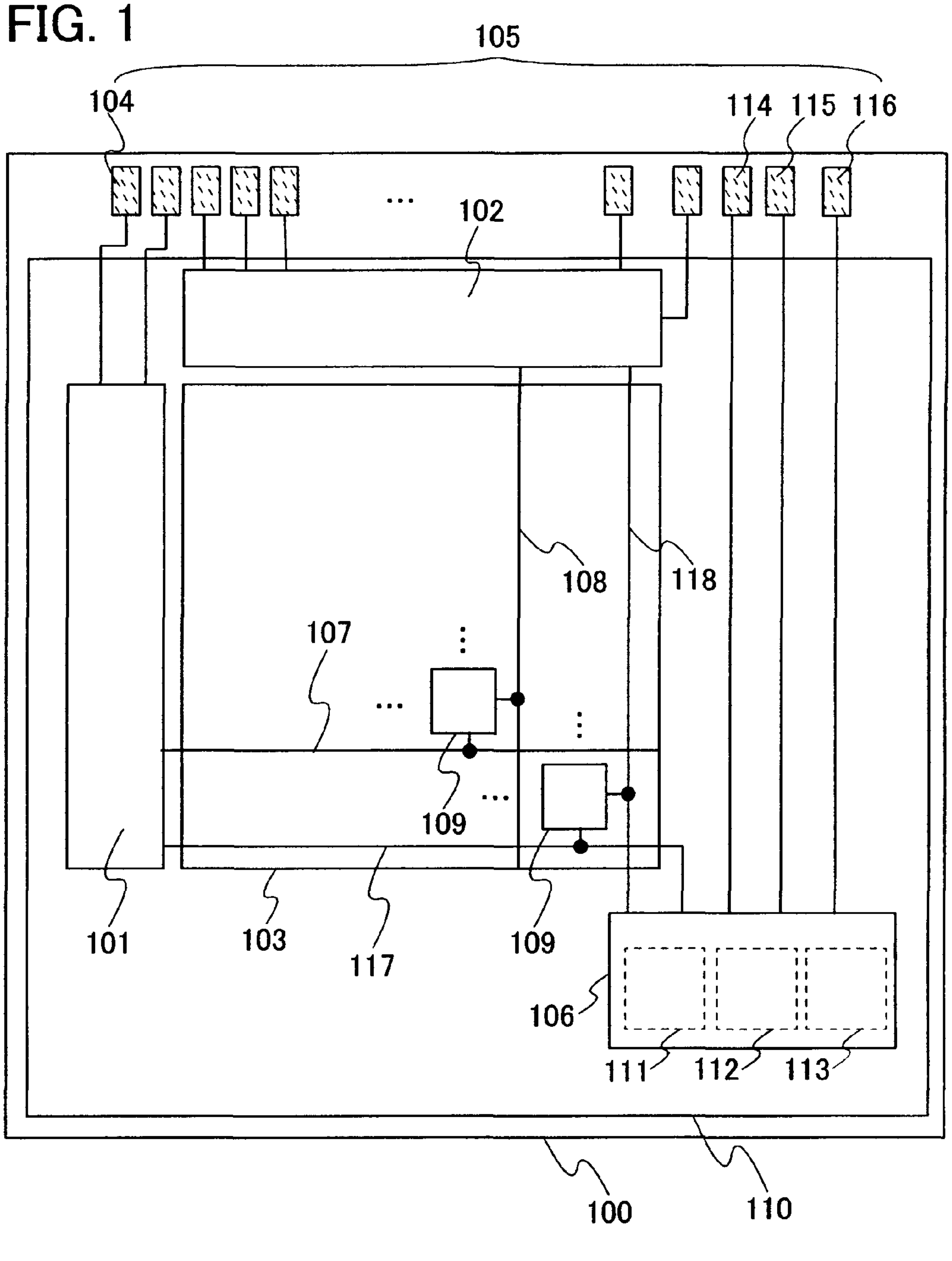
FIG. 1 is a block diagram of a structure of the present invention.

FIG. 1 is a block diagram of a display device in this embodiment mode, and detailed description will be made below. Note that a display device of the present invention means a device having a display element (e.g., a liquid crystal element or a light-emitting element). Further, it may mean a display panel itself in which a plurality of pixels including a display element such as a liquid crystal element or an EL element, and/or a peripheral driver circuit for driving the pixels are/is formed over a substrate. Further, the display device may include the display panel provided with a flexible printed circuit (FPC) or a printed wiring board (PWB). A light-emitting device means a display device having, particularly, a self-luminous type display element such as an EL element or an element used in an FED. A liquid-crystal display device means a display device having a liquid crystal element.

FIG. 1 shows a basic structure of the present invention. A display device shown in FIG. 1 includes a gate signal line driver circuit 101, a source signal line driver circuit 102, a pixel portion 103, a connection terminal portion 105 in which a plurality of connection terminals are formed, and a test circuit 106 over a substrate 100. A gate line 107 is connected to the gate signal line driver circuit 101 whereas a source line 108 is connected to the source signal line driver circuit 102. A pixel 109 in the pixel portion 103 is connected to the gate line 107 and the source line 108. In the pixel 109, a transistor for writing a signal from the source line 108 to a light-emitting element or a liquid crystal element provided in the pixel, by a signal from the gate line 107 is provided, and terminals of the transistor are connected to the gate line 107 and the source line 108 respectively. An FPC (Flexible Printed Circuit, which is not shown) for inputting an external signal is connected to the connection terminal portion 105. Then, the substrate 100 is completed as a display module by being attached a counter substrate 110 for sealing the light-emitting element or the liquid crystal element provided in the pixel 109.

The test circuit 106 is provided on the side opposite to a portion in which a dummy gate line (also called a first wiring) 117 formed in parallel with the gate line is connected to the gate signal line driver circuit 101 whereas a dummy source line (also called a second wiring) 118 formed in parallel with the source line is connected to the source signal line driver circuit 102, with the pixel portion 103 interposed therebetween, and is connected to the dummy gate line 117 and the dummy source line 118. In this embodiment mode, the dummy gate line 117 is a dummy line which is one gate line connected to the pixels other than the pixels for performing display, and the dummy gate line 117 is formed at the same time as the gate line 107 and the same signal as that of the gate line 107 is supplied thereto. The dummy source line 118 is a dummy line which is one source line connected to the pixels other than the pixels for performing display, and the dummy source line 118 is formed at the same time as the source line 108 and the same signal as that of the source line 108 is supplied thereto. Further, in this embodiment mode, the pixels which are not for performing display and disposed in the same lines as those of the other pixels are called dummy pixels. The dummy pixels, the dummy gate line 117, and the dummy source line 118 are connected to the test circuit 106 so as not to affect display. By shielding a display surface of each dummy pixel from light, testing can be performed without affecting display by the other pixels. Note that description “the same signal as that of the gate line is supplied” means that formation is performed at the same time as the gate line 107, that is, the same material as that of the gate line 107 is used. Similarly, description “the same signal as that of the source line 108 is supplied” means that formation is performed at the same time as the source line 108, that is, the same material as that of the source line 108 is used.

The test circuit 106 detects a defect caused by the case where, in a relationship between potentials of the gate line 107 and the source line 108, the potential of the source line 108 is lower than the potential of the gate line 107 and a difference between a Low potential of the source line 108 and a Low potential of the gate line 107 is less than the threshold voltage (Vth) of the transistor for writing a signal from the source line 108. Specifically, in the test circuit 106, a first circuit 111 (also called a first comparison circuit) which compares the potential of the dummy gate line 117 and the potential of the dummy source line 118 and outputs a High potential when the potential of the dummy source line 118 is lower than the potential of the dummy gate line 117; a second circuit 112 (also called a subtraction circuit) which subtracts a reference potential from the potential of the dummy source line 118 and outputs its result; and a third circuit 113 (also called a second comparison circuit) which compares the potential of the dummy gate line 117 with the output of the second circuit 112 and outputs its result are provided. Then, a connection terminal 114 for outputting a result of the comparison in the first circuit 111, a connection terminal 115 for inputting the reference potential to the second circuit 112, and a connection terminal 116 for outputting a signal from the third circuit 113 are connected to the test circuit 106 from the connection terminal portion 105 by using a lead wiring. Note that the reference potential which is inputted to the second circuit 112 is preferably, in this specification, a potential almost equal to the threshold voltage (Vth) of the transistor for writing a signal from the source line, provided in the pixel; it is preferably about 0.1 to 2.0 V.

Figure 2:
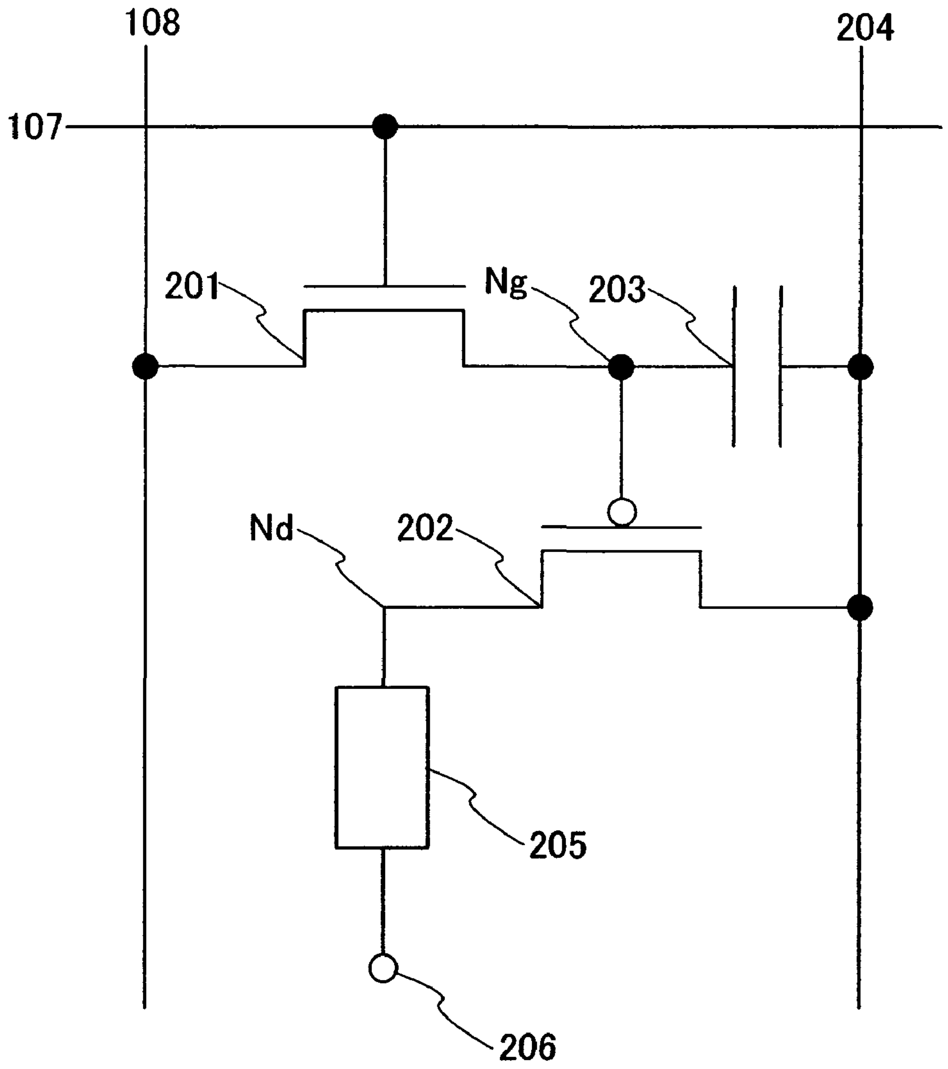
FIG. 2 is a circuit diagram of a pixel configuration of the present invention.
Figure 3:
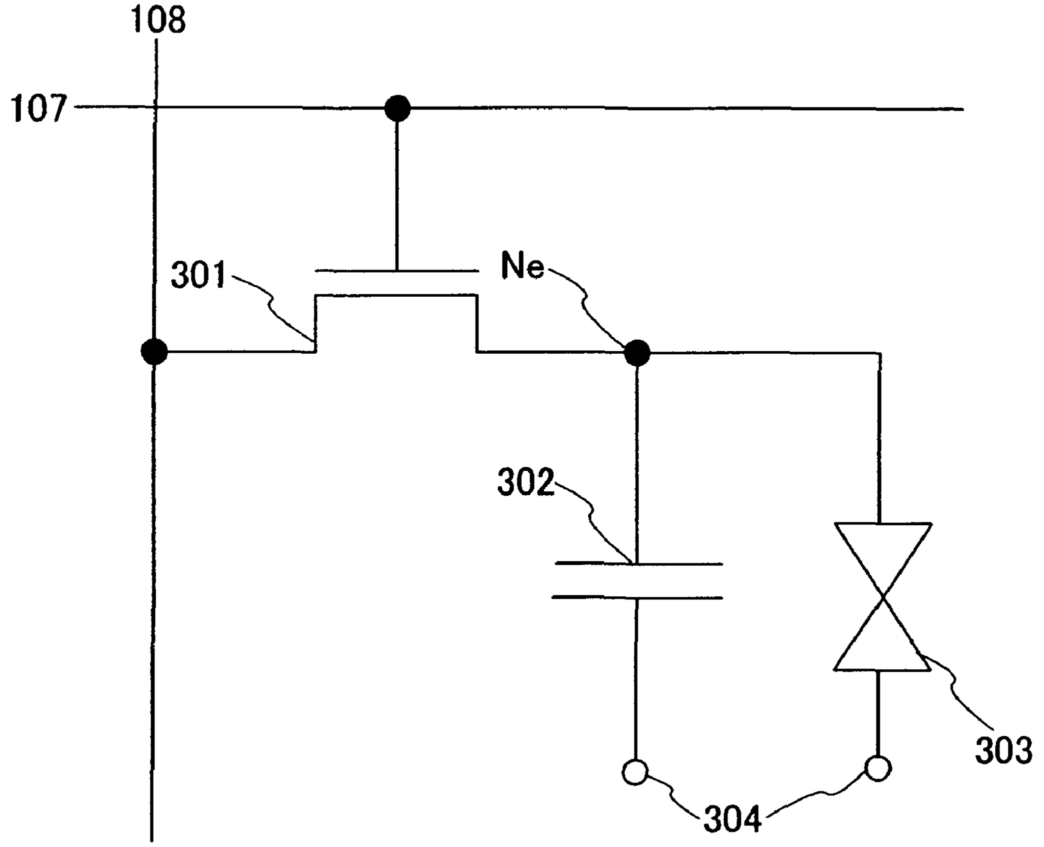
FIG. 3 is a circuit diagram of a pixel configuration of the present invention.

As for the pixel configuration of the pixel 109, specific examples are illustrated in FIGS. 2 and 3. In this embodiment mode, typical pixel configurations shown in FIGS. 2 and 3 in which a light-emitting element and a liquid crystal element are used as display media respectively will be described.

FIG. 2 illustrates a pixel configuration when a light-emitting element is used as a display medium, an n-channel transistor is used as a first transistor 201 (also called a writing transistor) for writing a signal from the source line, and a p-channel transistor is used as a second transistor 202 (also called a driving transistor) for driving the light-emitting element.

In FIG. 2, when the gate line 107 has a High potential, the first transistor 201 is turned on, and a potential of the source line 108 is held in a capacitor 203 and is reflected in a potential of a node Ng. On the other hand, when the gate line 107 has a Low potential, the first transistor 201 is turned off, and the potential held in the capacitor 203 is reflected in the potential of the node Ng regardless of the potential of the source line 108. When the potential of the node Ng is a High potential, a potential of a node Nd becomes a Low potential because the second transistor 202 is turned off. On the other hand, when the potential of the node Ng is a Low potential, the potential of the node Nd becomes a High potential because the second transistor 202 is turned on and a current flows from a power source line 204. This potential of the node Nd flows to a counter electrode 206 through a light-emitting element 205.

Note that in this specification, description “transistor is on” means that a gate-source voltage of the transistor exceeds the threshold voltage of the transistor and a current flows between the source and the drain, whereas description “transistor is off” means that the gate-source voltage of the transistor is lower than the threshold voltage of the transistor and no current flows between the source and the drain.

Note also that in this specification, one pixel means one element capable of controlling brightness. Therefore, for example, one pixel means one color element by which brightness is expressed. In this case, therefore, in the case of a color display device having color elements of R (red), G (green), and B (blue), the minimum unit of an image is formed of three pixels of an R pixel, a G pixel, and a B pixel. The color elements are not limited to three colors, and more than three colors may also be used, such as RGBW (W is white). As another example, in the case where brightness for one color element is controlled using a plurality of areas, one of the areas is denoted by one pixel. For example, therefore, in the case of using an area grayscale method where there are a plurality of areas for controlling brightness per color element and a grayscale is expressed with the total of them, one of the areas for controlling brightness is denoted by one pixel. In this case, therefore, one color element is formed of a plurality of pixels. In this case also, the size of an area for performing display may be different depending on each pixel. Further, in the plurality of areas for controlling brightness provided per color element, namely in the plurality of pixels forming one color element, signals supplied thereto respectively may be different so as to increase a viewing angle. Note that description "one pixel (for three colors)" denotes that three pixels of R, G, and B are considered one pixel; description "one pixel (for one color)" denotes that a plurality of pixels provided per color element is considered one pixel in total.

FIG. 3 illustrates a pixel configuration when a liquid crystal element is used as a display medium and an n-channel transistor is used as a transistor 301 for writing a signal from the source line.

In FIG. 3, when the gate line 107 has a High potential, the transistor 301 is turned on, and a potential of the source line 108 is held in a capacitor 302 and is reflected in a potential of a node Ne. On the other hand, when the gate line 107 has a Low potential, the transistor 301 is turned off, and the potential held in the capacitor 302 is reflected in the potential of the node Ne regardless of the potential of the source line 108. With this potential of the node Ne and a potential of a counter electrode 304, a liquid crystal element 303 is driven.

Figure 4:
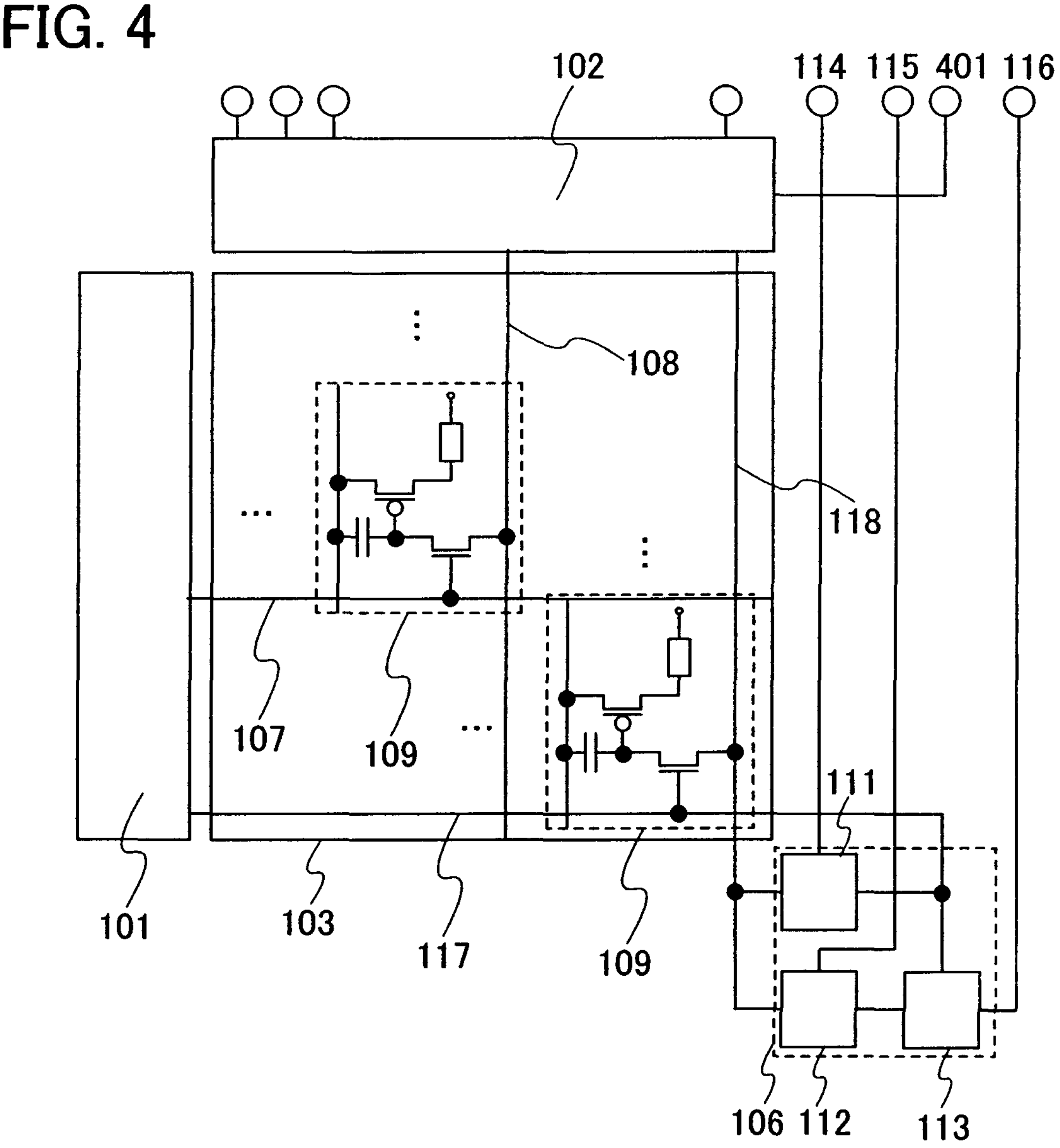
FIG. 4 is a block diagram of a structure of the present invention.
Figure 5:
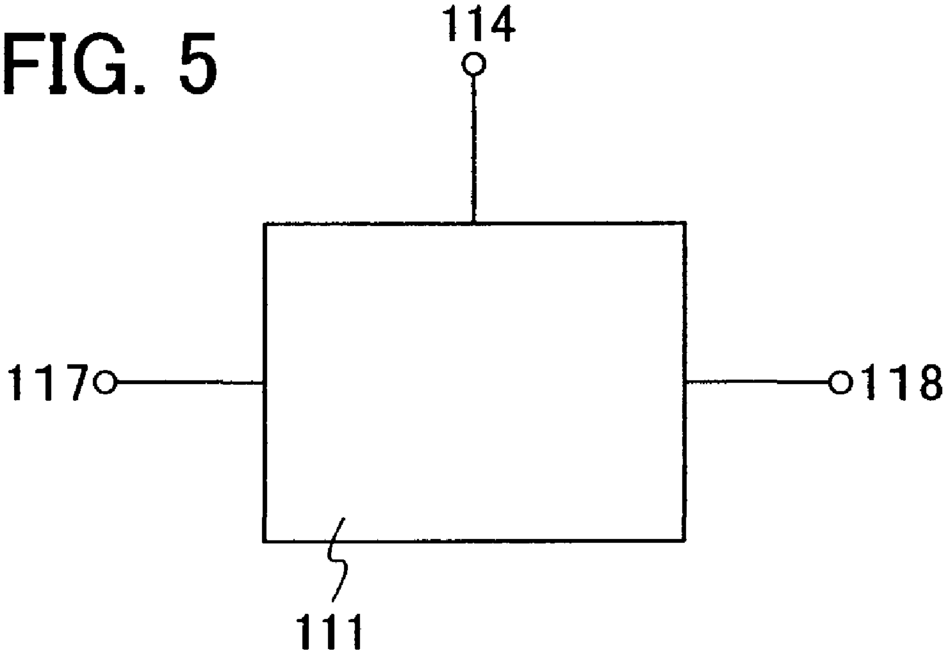
FIG. 5 is circuit diagrams of a test circuit of the present invention.
Figure 5:
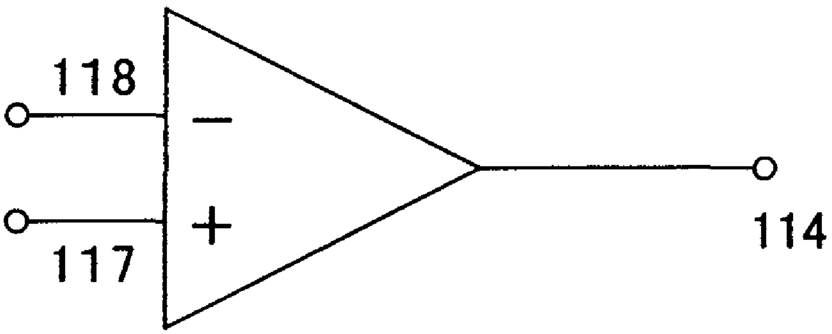
Figure 6:
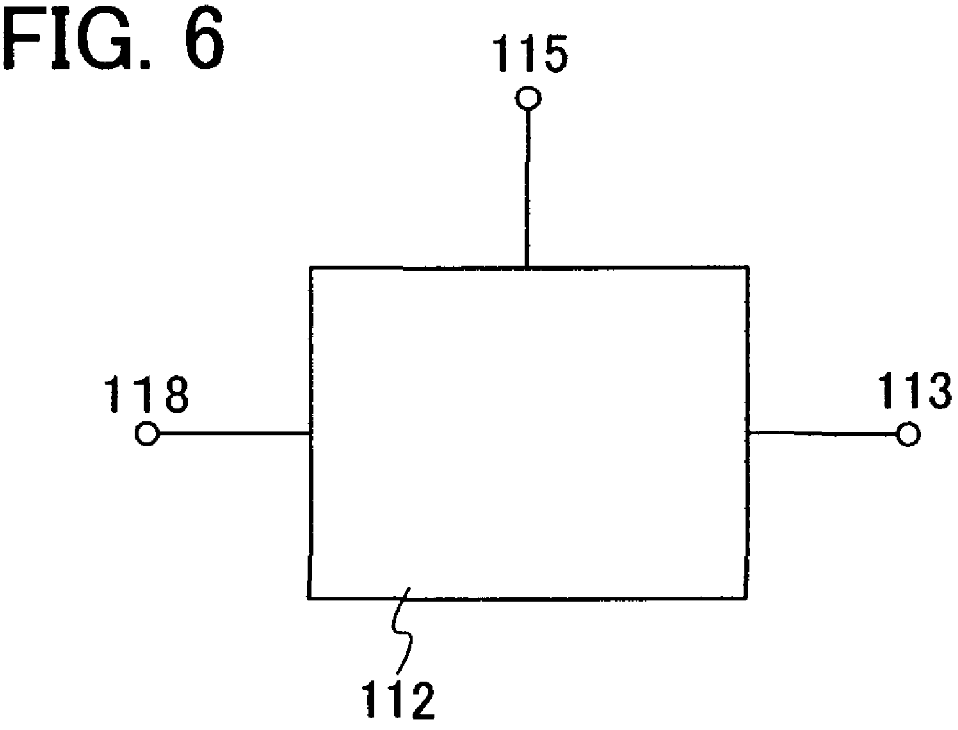
FIG. 6 is circuit diagrams of a test circuit of the present invention.
Figure 6:
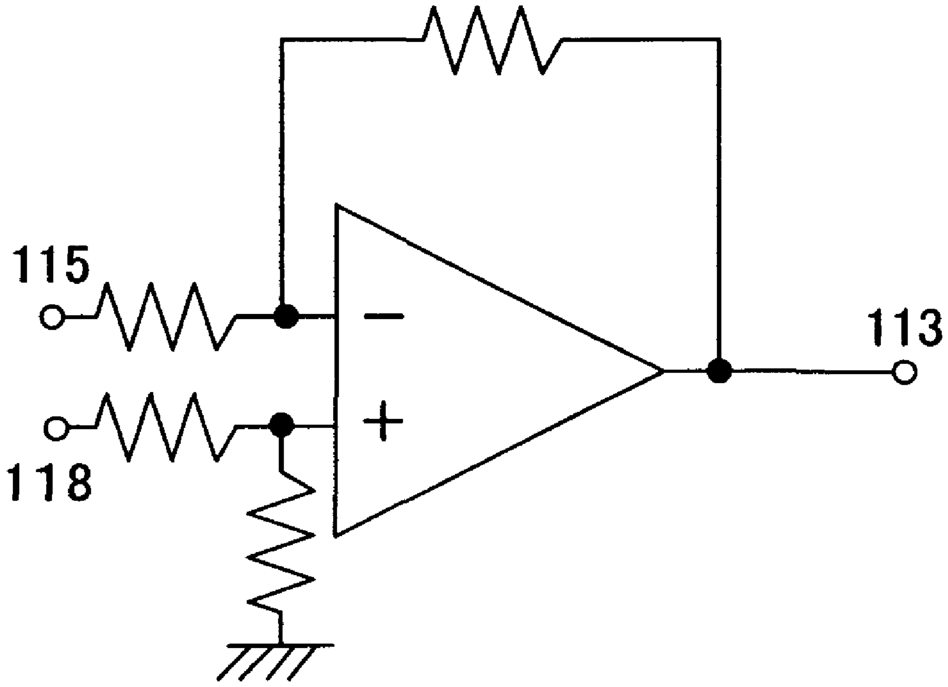
Figure 7:
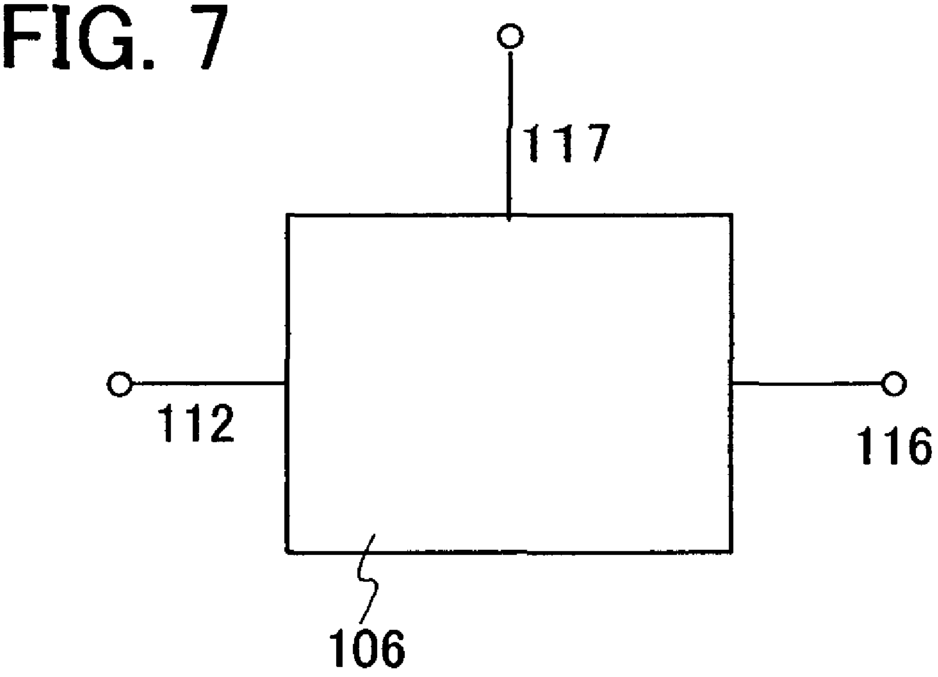
FIG. 7 is circuit diagrams of a test circuit of the present invention.
Figure 7:
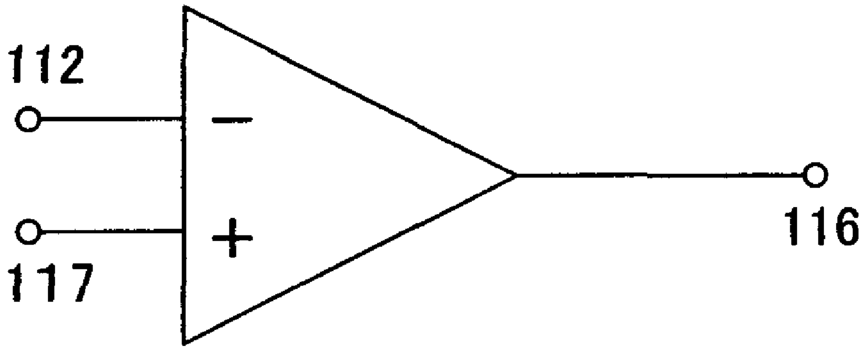

Next, FIG. 4 illustrates the case where a light-emitting element using an organic material for a light-emitting layer is adopted as a display medium of the present invention, in each pixel. Each pixel has the configuration shown in FIG. 2 in which the first transistor, the second transistor, the capacitor, and the light-emitting element are included. In FIG. 4 also, connection of the first circuit 111, the second circuit 112, and the third circuit 113 in the test circuit 106 shown in FIG. 1 is illustrated. Further, circuit structures of the first circuit 111, the second circuit 112, and the third circuit 113 are illustrated in FIGS. 5, 6, and 7 respectively.

FIG. 4 shows the basic structure of the present invention in FIG. 1 in more detail. Note that in FIG. 4, the same portions as those in FIG. 1 are denoted by the same reference numerals, and description thereof is omitted. A display device shown in FIG. 4 includes the gate signal line driver circuit 101, the source signal line driver circuit 102, the pixel portion 103, the connection terminal portion (not shown) in which the plurality of connection terminals (not shown) are formed, and the test circuit 106 over the substrate (not shown). The gate line 107 is connected to the gate signal line driver circuit 101 whereas the source line 108 is connected to the source signal line driver circuit 102. Note that the writing control signal SWE is inputted to the source signal line driver circuit from a connection terminal 401. The pixel 109 in the pixel portion 103 is connected to the gate line 107 and the source line 108. In the pixel 109, the transistor for writing a signal from the source line 108 to the light-emitting element or the liquid crystal element provided in the pixel, by a signal from the gate line 107 is provided, and terminals of the transistor are connected to the gate line 107 and the source line 108 respectively. Then, the substrate is completed as a display module by being attached the counter substrate (not shown) for sealing the light-emitting element or the liquid crystal element provided in the pixel 109.

Further, the test circuit 106 detects a defect caused by the case where, in a relationship between potentials of the gate line 107 and the source line 108, the potential of the source line 108 is lower than the potential of the gate line 107 and lower than the threshold voltage (Vth) of the first transistor 201. Specifically, in the test circuit 106, the first circuit 111 (also called the first comparison circuit) which compares the potential of the dummy gate line 117 and the potential of the dummy source line 118 and outputs a High potential when the potential of the dummy source line 118 is lower than the potential of the dummy gate line 117; the second circuit 112 (also called the subtraction circuit) which subtracts a reference potential from the potential of the dummy source line 118 and outputs its result; and the third circuit 113 (also called the second comparison circuit) which compares the potential of the dummy gate line 117 with the output of the second circuit 112 and outputs its result are provided. Then, the connection terminal 114 for outputting a result of the comparison in the first circuit 111, the connection terminal 115 for inputting the reference potential to the second circuit 112, and the connection terminal 116 for outputting a signal from the third circuit 113 are connected to the test circuit 106 from the connection terminal portion 105 by using a lead wiring.

In the test circuit 106 in FIG. 4, the first circuit 111 is connected to the dummy gate line 117, the dummy source line 118, and the connection terminal 114. The second circuit 112 is connected to the dummy source line 118, the connection terminal 115 for inputting the reference potential, and the third circuit 113. The third circuit 113 is connected to the second circuit 112, the dummy gate line 117, and the connection terminal 116 for outputting a signal from the third circuit 113. Note that the reference potential which is inputted to the second circuit 112 is preferably, in this specification, a potential almost equal to the threshold voltage (Vth) of the first transistor 201 provided in the pixel; it is preferably about 0.1 to 2.0 V The writing control signal SWE (source write enable signal) in FIG. 4 is a signal for selecting writing or erasing of a signal of the source line. By inputting a High potential of the writing control signal SWE to the source signal line driver circuit, a High potential is written to the source line, whereas by inputting a Low potential of the writing control signal SWE to the source signal line driver circuit, a Low potential is written to the source line.

Note that, in the present invention, description "being performed" includes electrical connection and direct connection. Therefore, each structure disclosed by the present invention includes an element other than the predetermined connection. For example, in the state where a circuit A is electrically connected to a circuit B, any element (e.g., a switch, a transistor, a capacitor, an inductor, a resistor, or a diode) capable of the electrical connection between the circuit A and the circuit B may be disposed between the circuit A and the circuit B. Further, in the state where the circuit A and the circuit B are directly connected to each other, the circuit A and the circuit B may be disposed without interposing any element therebetween. Note that the state where the circuit A and the circuit B are directly connected to each other without interposing any element capable of electrical connection therebetween, except the state where the circuit A and the circuit B are electrically connected, is described as "being directly connected".

Next, FIGS. 5, 6, and 7 illustrate circuit structures and connections of the first circuit 111, the second circuit 112, and the third circuit 113 respectively.

A block diagram and a circuit diagram of the first circuit 111 in FIGS. 1 and 4 are shown in FIG. 5. The first circuit 111 is a comparison circuit for comparing the potential of the dummy gate line 117 and the potential of the dummy source line 118 with each other, in which the dummy gate line 117 is connected to a non-inversion input terminal of an operational amplifier shown in FIG. 5 while the dummy source line 118 is connected to an inversion input terminal thereof. By the first circuit 111, whether the potential of the dummy source line 118 is lower than the potential of the dummy gate line 117 or not can be detected, so that whether the potential of the source line 108 is lower than the potential of the gate line 107 or not can be detected. In the case where the potential of the source line 108 is lower than the potential of the gate line 107, a High potential is outputted from an output terminal of the operational amplifier to the connection terminal 114. Note that a negative power supply used as a power supply of the operational amplifier in the first circuit 111 is preferably a power supply having a potential lower by 2 V than the Low potential of the gate line 107.

Next, a block diagram and a circuit diagram of the second circuit 112 in FIGS. 1 and 4 are shown in FIG. 6. The second circuit 112 is formed of a subtraction circuit including an operational amplifier and resistors. In the second circuit 112, the potential of the dummy source line 118 is connected to a non-inversion input terminal of the operational amplifier while the reference potential inputted to the connection terminal 115 is connected to an inversion input terminal thereof. The second circuit 112 outputs a potential which is obtained by subtracting the reference potential from the potential of the dummy source line 118 to the third circuit 113. At this time, resistance of the resistors in the subtraction circuit in the second circuit 112 is preferably equal to one another. Further, the reference potential is preferably a potential almost equal to the threshold voltage (Vth) of the first transistor provided in the pixel; it is preferably about 0.1 to 2.0 V Next, a block diagram and a circuit diagram of the third circuit 113 in FIGS. 1 and 4 are shown in FIG. 7. The third circuit 113 is a comparison circuit including an operational amplifier, and compares the potential of the output of the second circuit 112 and the potential of the dummy gate line 117 with each other. In the third circuit 113, the output of the second circuit 112 is connected to an inversion input terminal of the operational amplifier while the potential of the dummy gate line 117 is connected to a non-inversion input terminal thereof. Then, the potential of the dummy gate line 117 and the output potential of the second circuit 112 are compared with each other, and when the output potential of the second circuit 112 is lower than the potential of the dummy gate line 117, a High potential is outputted from an output terminal of the operational amplifier to the connection terminal 116. In this manner, a verge just before the potential which is obtained by subtracting the threshold voltage (Vth) of the first transistor 201 from the potential of the dummy source line 118 becomes lower than the potential of the dummy gate line 117, and lower than the potential of the gate line 107 can be detected.

Consequently, a display device in which the test circuit 106 and the pixel portion 103 are provided over the same substrate and the test circuit and the pixel portion are sealed with the counter substrate 110 in FIG. 1 can be manufactured. In the display device of this embodiment mode, since the connection terminal 114 is provided outside the region sealed with the counter substrate, even in a display period of the display device, a signal outputted from the first circuit 111 to the connection terminal 114, which is an output of the test circuit 106, can be tested using a probe connected to a measuring instrument from the outside of the region sealed with the counter substrate, so that a defect of the display device can be detected. In addition, since the connection terminal 116 is provided outside the region sealed with the counter substrate, even in the display period of the display device, a signal outputted from the third circuit 113, which is obtained by subtracting the threshold voltage of the first transistor from the potential of the dummy source line 118 can be tested using a probe connected to a measuring instrument from the outside of the region sealed with the counter substrate. Note that the connection terminals 114, 115, and 116 may be provided together in the same portion as that of the connection terminals for inputting a video signal or a timing signal for performing display, or alternatively, may be provided at tips of wirings which are led to another portion.

Next, specific operations of FIGS. 1 and 4 will be described using a timing chart shown in FIG. 8 and the like.

Figure 8:
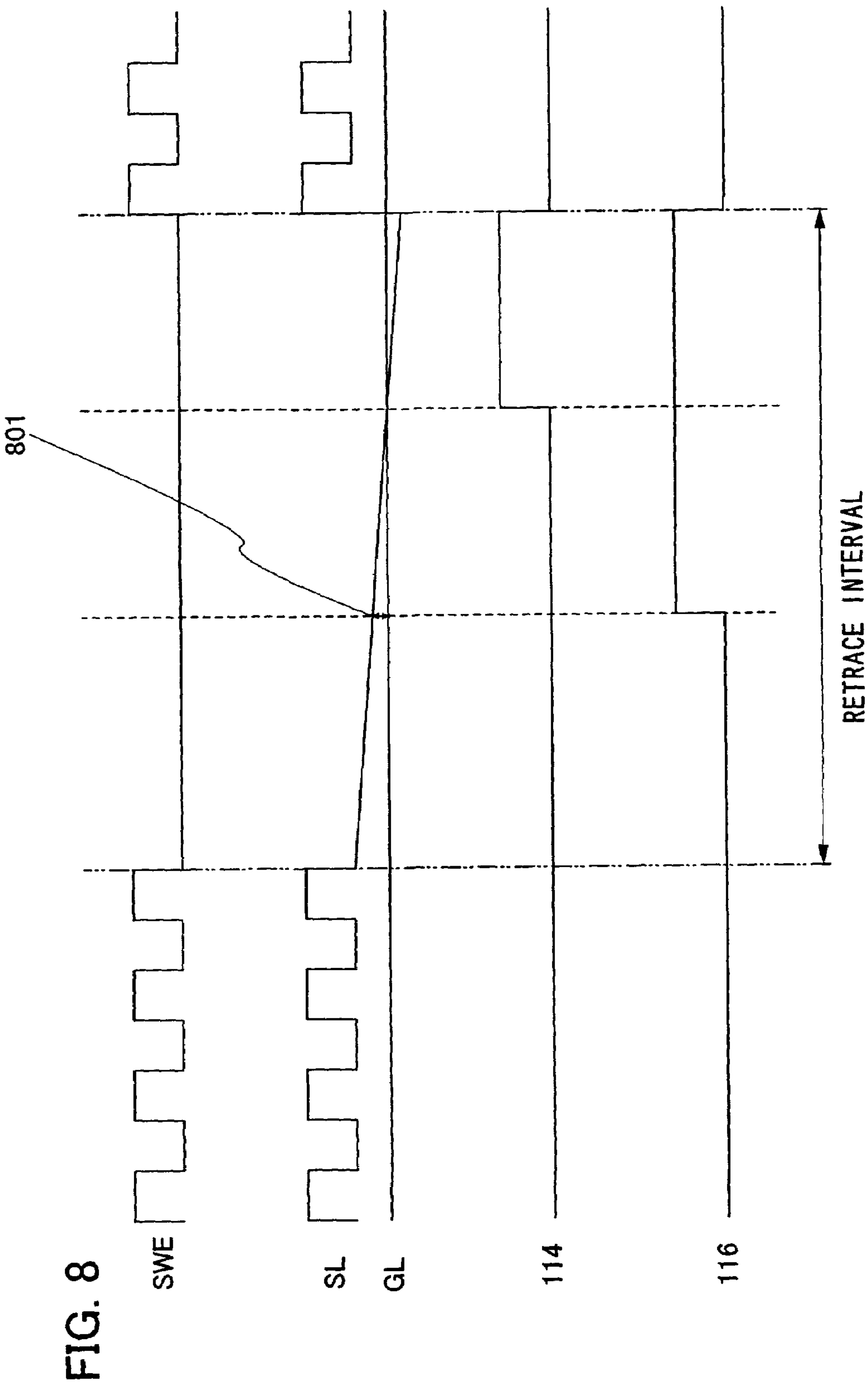
FIG. 8 is a timing chart of a structure of the present invention.

The timing chart shown in FIG. 8 is a timing chart of respective potentials of signals and wirings of the writing control signal (SWE), a source line potential (SL), a gate line potential (GL), the connection terminal 114, and the connection terminal 116. Note that in FIG. 8, the potential relationship between SL and GL is also shown, by which it can be seen that SL is normally higher than GL. In FIG. 8, during a period in which a Low potential of the writing control signal is inputted, such as in a retrace interval in the display device, a signal is not inputted to the source line. Therefore, SL is decreased in the retrace interval. Then, SL becomes lower than GL so that the first transistor in the pixel shown in FIG. 2 cannot keep a desired operation; therefore, the display device is defective (see SL in FIG. 8).

In FIG. 8, as described in the above description of the test circuit, when the signal outputted from the first circuit 111 in the test circuit 106 to the connection terminal 114 is a High potential, SL is lower than GL. Further, the reference potential inputted to the second circuit 112 is denoted by an arrow 801 in FIG. 8. In this case, when GL becomes lower than a potential which is obtained by subtracting a potential difference of the arrow 801 which is the threshold voltage (Vth) of the first transistor 201 from SL, a High potential is outputted from the connection terminal 116. Note that in this embodiment mode, since delay of each signal of the wirings does not affect the actual operations in FIG. 8, each potential of the wirings is illustrated in synchronization with signal rising and falling.

Note that although a light-emitting element is given as an example of a display element in this embodiment mode, any display element of performing display in an active matrix display device which is operated by a gate line and a source line can be used. For example, a display medium whose contrast varies by an electromagnetic action can be used as a display element, such as an EL element (e.g., an organic EL element, an inorganic EL element, or an EL element containing an organic matter and an inorganic matter), an electron-emitting element, a liquid crystal element, electronic ink, a grating light valve (GLV), a plasma display panel (PDP), a digital micromirror device (DMD), a piezoceramic display device, or a carbon nanotube. Note that a display device using an EL element includes an EL display, a display device using an electron-emitting element includes a field emission display (FED), an SED flat-panel display (SED: Surface-conduction Electron-emitter Display), and the like, a display device using a liquid crystal element includes a liquid crystal display, and a display device using electronic ink includes electronic paper.

This embodiment mode can also be arbitrarily combined with another embodiment mode in this specification.

Embodiment Mode 2

This embodiment mode will describe a structure other than the above-described embodiment mode. Note that portions having the same functions as those in Embodiment Mode 1 are denoted by the same reference symbols, and the description in Embodiment Mode 1 is applied thereto.

Figure 9:
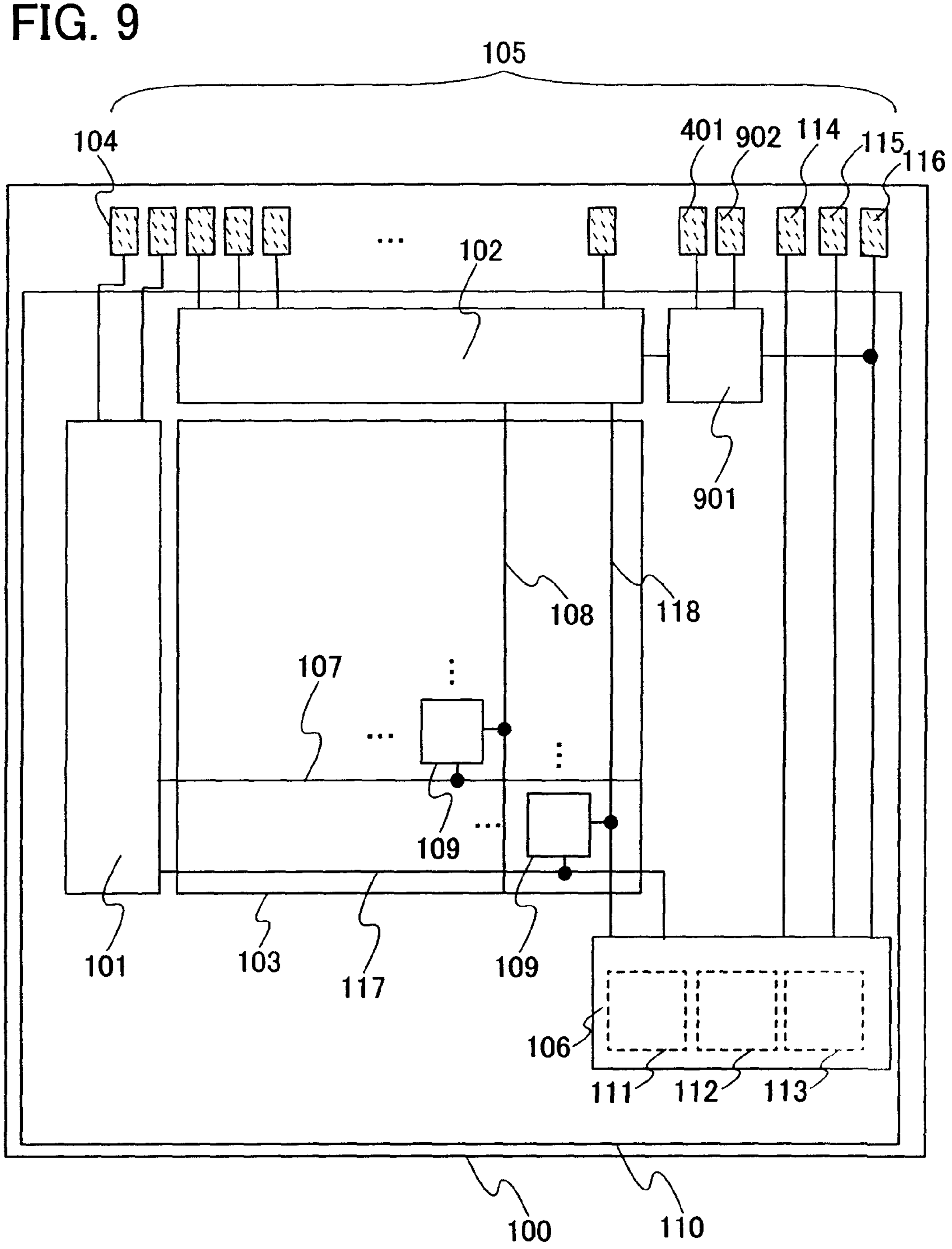
FIG. 9 is a block diagram of a structure of the present invention.

FIG. 9 is a block diagram of a display device in this embodiment mode, and detailed description will be made below. Note that a display device of the present invention means a device having a display element (e.g., a liquid crystal element or a light-emitting element). Further, the display device may mean a display panel itself in which a plurality of pixels including a display element such as a liquid crystal element or an EL element, and/or a peripheral driver circuit for driving the pixels are/is formed over a substrate. Further, the display device may include the display panel provided with a flexible printed circuit (FPC) or a printed wiring board (PWB). A light-emitting device means a display device having, particularly, a self-luminous type display element such as an EL element or an element used in an FED. A liquid-crystal display device means a display device having a liquid crystal element.

FIG. 9 shows a structure of this embodiment mode. A display device shown in FIG. 9 includes the gate signal line driver circuit 101, the source signal line driver circuit 102, the pixel portion 103, the connection terminal portion 105 in which the plurality of connection terminals 104 are formed, the test circuit 106, and a correction circuit 901 over the substrate 100. The gate line 107 is connected to the gate signal line driver circuit 101 whereas the source line 108 is connected to the source signal line driver circuit 102. The pixel 109 in the pixel portion 103 is connected to the gate line 107 and the source line 108. In the pixel 109, the transistor for writing a signal from the source line 108 to a light-emitting element or a liquid crystal element provided in the pixel, by a signal from the gate line 107 is provided, and terminals of the transistor are connected to the gate line 107 and the source line 108 respectively. An FPC (Flexible Printed Circuit, which is not shown) for inputting an external signal is connected to the connection terminal portion 105. Then, the substrate 100 is completed as a display module by being attached the counter substrate 110 for sealing the light-emitting element or the liquid crystal element provided in the pixel 109.

The test circuit 106 is provided on the side opposite to a portion in which the dummy gate line 117 is connected to the gate signal line driver circuit 101 whereas the dummy source line 118 is connected to the source signal line driver circuit 102, and is connected to the dummy gate line 117 and the dummy source line 118. In FIG. 9, the dummy gate line 117 and the dummy source line 118 connected to the test circuit are one gate line and one source line which are connected to the pixels other than the pixels for performing display. In this embodiment mode, the pixels which are not for performing display and disposed in the same lines as those of the other pixels for performing display are called dummy pixels. The source line connected to the dummy pixels is called a dummy line in a source line direction whereas the gate line connected to the dummy pixels is called a dummy line in a gate line direction. The dummy pixels and the dummy lines are connected to the test circuit 106 so as not to affect display. Accordingly, the dummy lines connected to the dummy pixels are connected to the test circuit 106 in this embodiment mode. By shielding a display surface of each dummy pixel from light, testing can be performed without affecting display by the pixels for performing display. In this embodiment mode also, the dummy line which is formed at the same time as the gate line and to which the same signal as that of the gate line is called a first wiring whereas the dummy line which is formed at the same time as the source line and to which the same signal as that of the source line is called a second wiring. Note that description “the same signal as that of the gate line is supplied” means that formation is performed at the same time as the gate line, that is, the same material as that of the gate line is used. Similarly, description “the same signal as that of the source line is supplied” means that formation is performed at the same time as the source line, that is, the same material as that of the source line is used.

The test circuit 106 detects a defect caused by the case where, in a relationship between potentials of the gate line 107 and the source line 108, the potential of the source line 108 is lower than the potential of the gate line 107 and the difference between a Low potential of the source line 108 and a Low potential of the gate line 107 is less than the threshold voltage (Vth) of the transistor for writing a signal from the source line 108. Specifically, in the test circuit 106, the first circuit 111 (also called the first comparison circuit) which compares the potential of the dummy gate line 117 and the potential of the dummy source line 118 and outputs a High potential when the potential of the dummy source line 118 is lower than the potential of the dummy gate line 117; the second circuit 112 (also called the subtraction circuit) which subtracts a reference potential from the potential of the dummy source line 118 and outputs its result; and the third circuit 113 (also called the second comparison circuit) which compares the potential of the dummy gate line 117 with the output of the second circuit 112 and outputs its result are provided. Then, the connection terminal 114 for outputting a result of the comparison in the first circuit 111, the connection terminal 115 for inputting the reference potential to the second circuit 112, and the connection terminal 116 for outputting a signal from the third circuit 113 are connected to the test circuit 106 from the connection terminal portion 105 by using a lead wiring. Note that the reference potential which is inputted to the second circuit 112 is preferably, in this specification, a potential almost equal to the threshold voltage (Vth) of the transistor for writing a signal from the source line, provided in the pixel; it is preferably about 0.1 to 2.0 V.

In addition, the correction circuit 901 is connected to a wiring which is led from the test circuit 106 to the connection terminal 116, the connection terminal 401, and a connection terminal 902. The signal outputted from the third circuit 113 is inputted to the connection terminal 116 connected to the test circuit 106, the writing control signal SWE is inputted to the connection terminal 401, and a signal SWEWE of controlling the writing control signal is inputted to the connection terminal 902. Then, the writing control signal which is controlled by the correction circuit 901 is inputted to the source signal line driver circuit.

Note that the writing control signal SWE (source write enable signal) in FIG. 9 is a signal for selecting writing or erasing of a signal of the source line. By inputting a High potential of the writing control signal SWE to the source signal line driver circuit, a High potential is written to the source line, whereas by inputting a Low potential of the writing control signal SWE to the source signal line driver circuit, a Low potential is written to the source line. The signal SWEWE of controlling the writing control signal in FIG. 9 is a signal for selecting supplying of the writing control signal to the source signal line driver circuit. By inputting a Low potential of the signal SWEWE of controlling the writing control signal to the correction circuit, the writing control signal SWE is supplied to the source signal line driver circuit, whereas by inputting a High potential of the signal SWEWE of controlling the writing control signal to the correction circuit, whether output of the writing control signal SWE is supplied to the source signal line driver circuit or stopped is selected.

As for a pixel configuration of the pixel 109, the description of the examples shown in FIGS. 2 and 3 in Embodiment Mode 1 is applied thereto.

Figure 10:
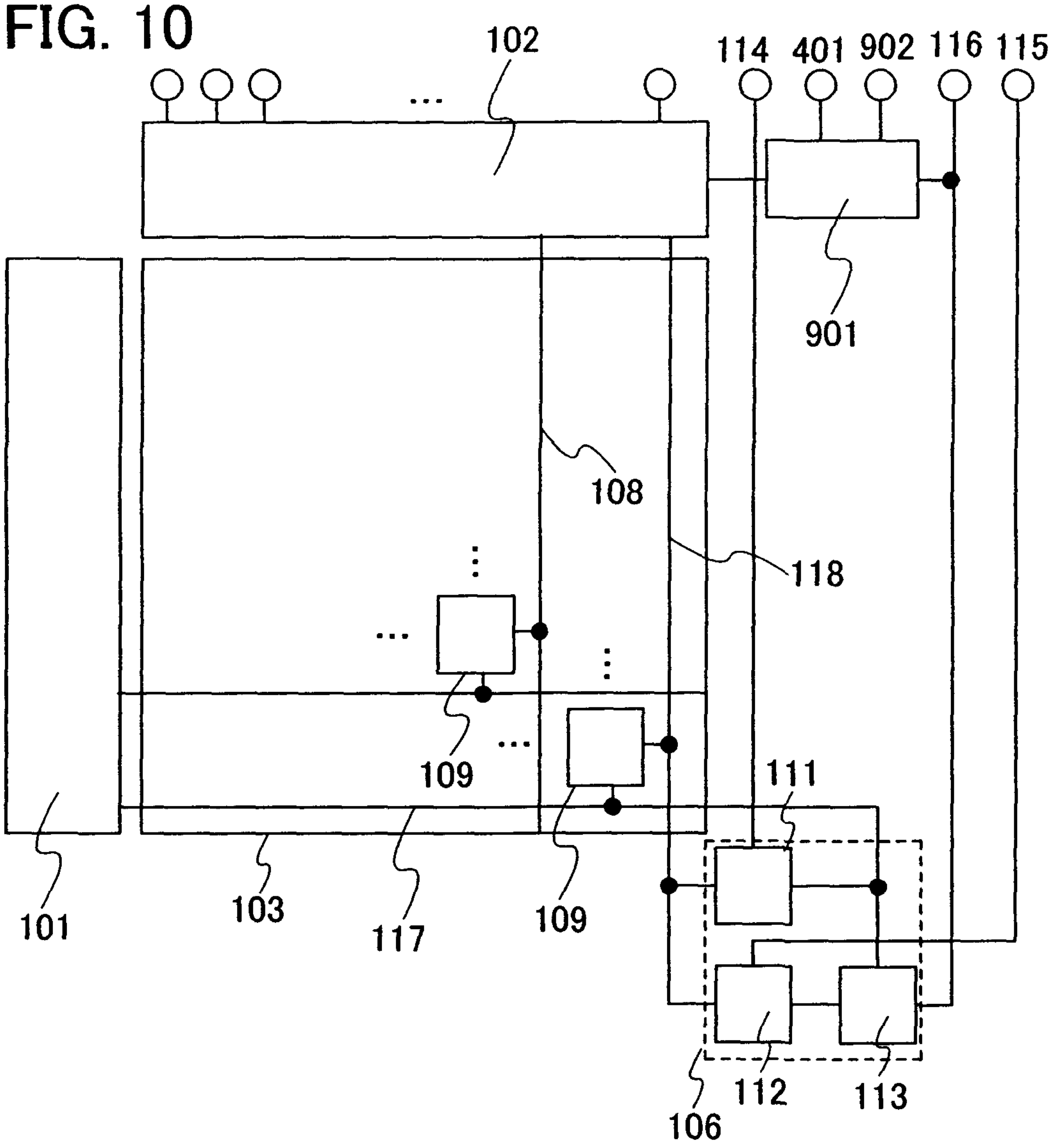
FIG. 10 is a block diagram of a structure of the present invention.

Next, FIG. 10 illustrates connections of the first circuit 111, the second circuit 112, and the third circuit 113 in the test circuit 106 shown in FIG. 9. Note that FIG. 10 illustrates the case where, similarly to the case in FIG. 4, a light-emitting element using an organic material for a light-emitting layer is adopted as a display medium in each pixel, having a configuration in which the first transistor, the second transistor, the capacitor, and the light-emitting element are included. Description in this embodiment mode will be made on the same case. As for circuit structures of the first circuit 111, the second circuit 112, and the third circuit 113, the description of the example shown in FIGS. 5, 6, and 7 in Embodiment Mode 1 is applied thereto. As the pixel configuration of the pixel 109, the configuration shown in FIG. 2 in which the first transistor, the second transistor, the capacitor, and the light-emitting element are included is adopted.

FIG. 10 shows the basic structure of the present invention in FIG. 9 in more detail. Note that in FIG. 10, the same portions as those in FIG. 9 are denoted by the same reference numerals, and description thereof is omitted. A display device shown in FIG. 10 includes the gate signal line driver circuit 101, the source signal line driver circuit 102, the pixel portion 103, the connection terminal portion (not shown) in which the plurality of connection terminals (not shown) are formed, the test circuit 106, and the correction circuit 901 over the substrate (not shown). The gate line 107 is connected to the gate signal line driver circuit 101 whereas the source line 108 is connected to the source signal line driver circuit 102. Note that the writing control signal SWE is inputted to the source signal line driver circuit from the connection terminal 401. The pixel 109 in the pixel portion 103 is connected to the gate line 107 and the source line 108. In the pixel 109, the transistor for writing a signal from the source line 108 to a light-emitting element or a liquid crystal element provided in the pixel, by a signal from the gate line 107 is provided, and terminals of the transistor are connected to the gate line 107 and the source line 108 respectively. Then, the substrate is completed as a display module by being attached the counter substrate (not shown) for sealing the light-emitting element or the liquid crystal element provided in the pixel 109.

Further, the test circuit 106 detects a defect caused by the case where, in a relationship between potentials of the gate line 107 and the source line 108, the potential of the source line 108 is lower than the potential of the gate line 107 and lower than the threshold voltage (Vth) of the first transistor 201. Specifically, in the test circuit 106, the first circuit 111 (also called the first comparison circuit) which compares the potential of the dummy gate line 117 and the potential of the dummy source line 118 and outputs a High potential when the potential of the dummy source line 118 is lower than the potential of the dummy gate line 117; the second circuit 112 (also called the subtraction circuit) which subtracts a reference potential from the potential of the dummy source line 118 and outputs its result; and the third circuit 113 (also called the second comparison circuit) which compares the potential of the dummy gate line 117 with the output of the second circuit 112 and outputs its result are provided. Then, the connection terminal 114 for outputting a result of the comparison in the first circuit 111, the connection terminal 115 for inputting the reference potential to the second circuit 112, and the connection terminal 116 for outputting a signal from the third circuit 113 are connected to the test circuit 106 from the connection terminal portion 105 by using a lead wiring.

In the test circuit 106 in FIG. 10, the first circuit 111 is connected to the dummy gate line 117, the dummy source line 118, and the connection terminal 114. The second circuit 112 is connected to the dummy source line 118, the connection terminal 115 for inputting the reference potential, and the third circuit 113. The third circuit 113 is connected to the second circuit 112, the dummy gate line 117, and the connection terminal 116 for outputting a signal from the third circuit 113. Note that the reference potential which is inputted to the second circuit 112 is preferably, in this specification, a potential almost equal to the threshold voltage (Vth) of the first transistor 201 provided in the pixel; it is preferably about 0.1 to 2.0 V.

In addition, the correction circuit 901 is connected to a wiring which is led from the test circuit 106 to the connection terminal 116, the connection terminal 401, and the connection terminal 902. The signal outputted from the third circuit 113 is inputted to the connection terminal 116 connected to the test circuit 106, the writing control signal SWE is inputted to the connection terminal 401, and the signal SWEWE of controlling the writing control signal is inputted to the connection terminal 902. Then, the writing control signal which is controlled by the correction circuit 901 is inputted to the source signal line driver circuit.

Note that the writing control signal SWE (source write enable signal) in FIG. 10 is a signal for selecting writing or erasing of a signal of the source line. By inputting a High potential of the writing control signal SWE to the source signal line driver circuit, a High potential is written to the source line, whereas by inputting a Low potential of the writing control signal SWE to the source signal line driver circuit, a Low potential is written to the source line. The signal SWEWE of controlling the writing control signal in FIG. 10 is a signal for selecting supplying of the writing control signal to the source signal line driver circuit; by inputting a Low potential of the signal SWEWE of controlling the writing control signal to the correction circuit, the writing control signal SWE is supplied to the source signal line driver circuit, whereas by inputting a High potential of the signal SWEWE of controlling the writing control signal to the correction circuit, whether output of the writing control signal SWE is supplied to the source signal line driver circuit or stopped is selected.

Note that, in the present invention, description "being connected" includes electrical connection and direct connection. Therefore, each structure disclosed by the present invention, any element (e.g., a switch, a transistor, a capacitor, an inductor, a resistor, or a diode) capable of the electrical connection may be interposed in the predetermined connection. Further, no element may be interposed in the predetermined connection. Note that the state where the connection is directly performed without interposing any element capable of electrical connection therein, except the state where the connection is electrically performed, is described as "being directly connected". Not also that description "being electrically connected" includes either the state where the connection is electrically performed or the state where the connection is directly performed.

Figure 11:
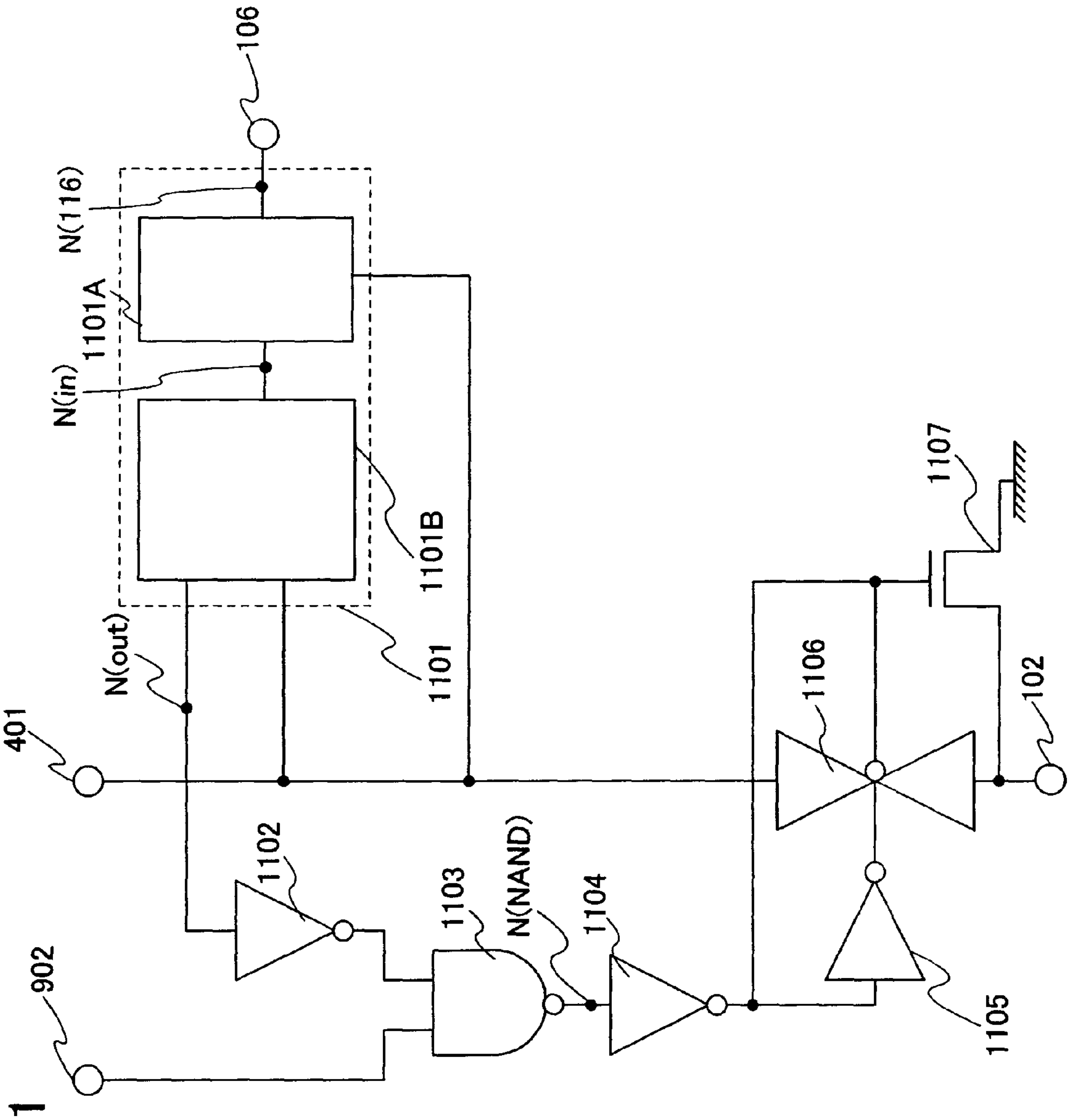
FIG. 11 is a circuit diagram of a correction circuit of the present invention.

Next, FIG. 11 illustrates a circuit structure and a connection of the correction circuit 901.

In FIG. 11, a block diagram and a circuit diagram of the correction circuit 901 in FIGS. 9 and 10 are shown. The correction circuit 901 includes: a memory circuit 1101 for holding the signal outputted from the test circuit 106 to the connection terminal 116 for a certain period; a first inverter circuit 1102 for inverting a signal from the memory circuit; a NAND circuit 1103 for obtaining a NAND between the signal SWEWE of controlling the writing control signal and an output of the first inverter circuit; a second inverter circuit 1104 for inverting an output signal of the NAND circuit 1103; a third inverter circuit 1105 for inverting an output from the second inverter circuit 1104; an analog switch 1106 which is controlled by the output from the second inverter circuit 1104 and an output from the third inverter circuit 1105; and a transistor 1107 which is controlled by the signal from the second inverter circuit 1104. Note that a node of an output terminal of the NAND circuit 1103 is denoted by N (NAND).

The memory circuit 1101 includes a signal switching circuit 1101A and a signal holding circuit 1101B. The signal switching circuit 1101A switches input/not-input of a signal from the test circuit 106. The signal holding circuit 1101B holds an output from the signal switching circuit 1101A for a certain period. Note that a node of an input terminal of the signal switching circuit 1101A is denoted by N (116), a node of an input terminal of the signal holding circuit 1101B is denoted by N (in), and a node of an output terminal of the signal holding circuit 1101B is denoted by N (out).

Further, the writing control signal SWE is inputted to the correction circuit 901. In the correction circuit 901, the writing control signal SWE is inputted to the signal switching circuit 1101A, the signal holding circuit 1101B, and an input terminal of the analog switch 1106.

Further, the transistor 1107 is an n-channel transistor in this embodiment mode, and an output from the second inverter circuit 1104 is outputted to a gate of the transistor 1107. When a signal from the second inverter circuit 1104 is a Low signal, the transistor 1107 is turned off and the analog switch 1106 is turned on so that the writing control signal is outputted from an output terminal of the analog switch 1106 to the source signal line driver circuit. On the other hand, when the signal from the second inverter circuit 1104 is a High signal, the analog switch 1106 is turned off and the transistor 1107 is turned on so that a GND potential connected to a first terminal of the transistor 1107 is outputted from a second terminal of the transistor 1107 to the source signal line driver circuit.

Note that in this specification, a transistor is an element having at least three terminals including a gate, a drain, and a source, and a channel region is provided between a drain region and a source region. Here, it is difficult to define the source and the drain since they are defined depending on the structure, operating condition, and the like of the transistor. Therefore, in the present invention, the regions functioning as the source and the drain are referred to as a first terminal and a second terminal. In a transistor, a gate means either all of or a part of a gate electrode and a gate wiring (also called a gate line, a gate signal line, or the like). A source means either all of or a part of a source region, a source electrode, and a source wiring (also called a source line, a source signal line, or the like); the same can be said for a drain.

Figure 22A:
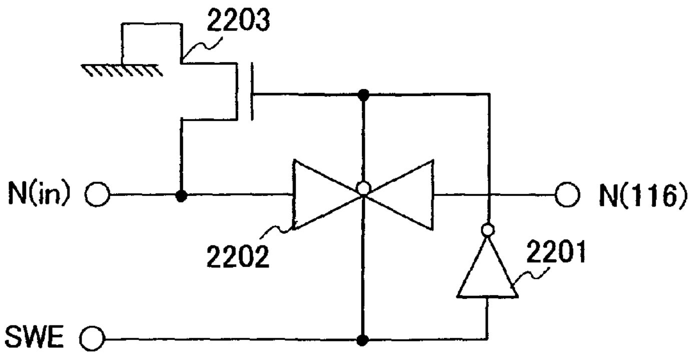
FIGS. 22A to 22D are circuit diagrams and a timing chart of a correction circuit of the present invention.
Figure 22B:
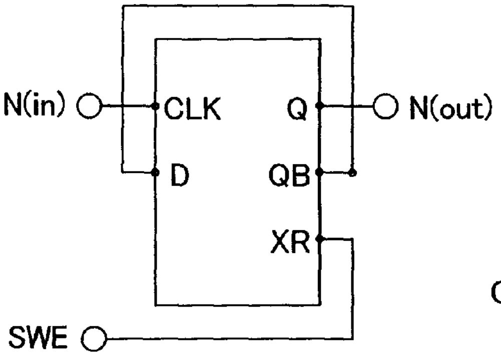
Figure 22C:
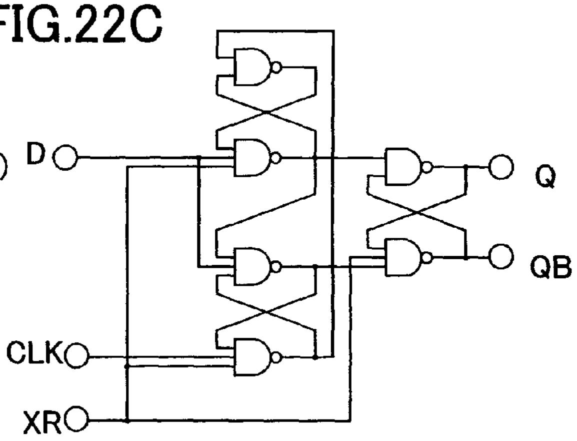

Next, in FIGS. 22A to 22C, circuit structures of the signal switching circuit 1101A and the signal holding circuit 1101B in FIG. 11 are illustrated. It is to be noted that the circuit structures shown in FIGS. 22A to 22C are merely examples, and the present invention is not limited thereto.

FIG. 22A shows an example of the signal switching circuit 1101A in FIG. 11, and includes an inverter circuit 2201, an analog switch 2202, and a transistor 2203. The transistor 2203 in FIG. 22A is an n-channel transistor, and the writing control signal SWE is outputted to a gate of the transistor 2203 through the inverter circuit 2201. When the writing control signal SWE is a High signal, the transistor 2203 is turned off and the analog switch 2202 is turned on so that a potential of the node N (116) is outputted from an output terminal of the analog switch 2202 to the node N (in). On the other hand, when the writing control signal SWE is a Low signal, the analog switch 2202 is turned off and the transistor 2203 is turned on so that a GND potential is outputted from a first terminal of the transistor 2203 to the node N (in) through a second terminal of the transistor 2203.

FIG. 22B shows an example of the signal holding circuit 1101B in FIG. 11, which is a D flip-flop circuit having terminals Q, QB, CLK, D, and XR. Further, FIG. 22C illustrates a circuit structure of the D flip-flop circuit in FIG. 22B. The D flip-flop circuit includes a plurality of NAND circuits. In the D flip-flop circuit in FIG. 22B, the terminal Q is connected to the node N (out), the terminal QB is connected to the terminal D, the terminal CLK is connected to the node N (in), and the writing control signal is inputted to the terminal XR.

Figure 22D:
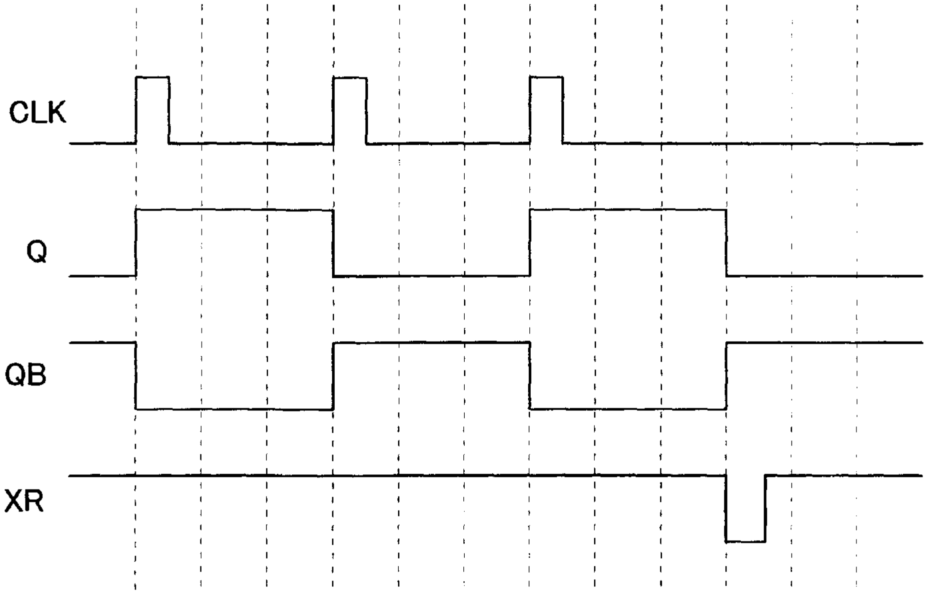

Further, FIG. 22D illustrates basic operations of the D flip-flop circuit in FIG. 22B. At rising of a signal inputted to the terminal CLK, the potentials of the terminals Q and QB are switched to a High potential and a Low potential respectively, and are kept until the next rising of the potential of the terminal CLK or until a Low potential is inputted to the terminal XR.

Next, specific operations of FIGS. 10 and 11 will be described using a timing chart shown in FIG. 12 or the like.

Figure 12:
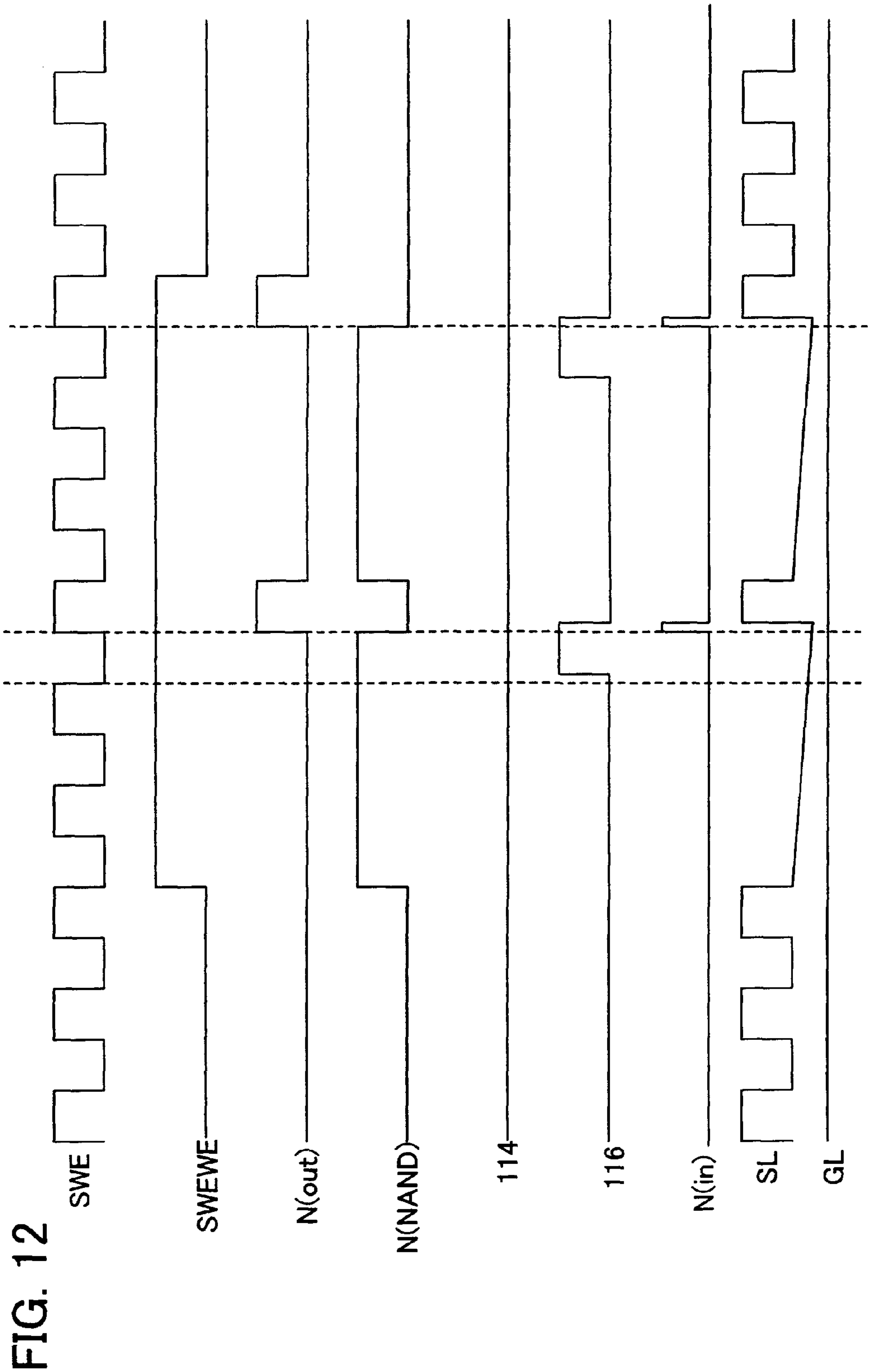
FIG. 12 is a timing chart of a structure of the present invention.

The timing chart shown in FIG. 12 is a timing chart of respective potentials of signals and wirings of the writing control signal SWE, the signal SWEWE of controlling the writing control signal, the node N (out), the node N (NAND), the connection terminal 114, the connection terminal 116, the node N (in), a source line potential (SL), and a gate line potential (GL). Note that in FIG. 12, the potential relationship between SL and GL is also shown, by which it can be seen that SL is normally higher than GL. In FIG. 12, when the potential of the signal SWEWE of controlling the writing control signal is a Low potential, the potential of the writing control signal SWE is reflected in the source line potential SL, whereas when the potential of the signal SWEWE of controlling the writing control signal is a High potential, the potential of the writing control signal SWE is not reflected in the source line potential SL. Therefore, the source line potential SL is decreased when the potential of the signal SWEWE of controlling the writing control signal is a High potential. Then, when the source line potential SL is lowered by the threshold voltage (Vth) of the first transistor 201, a High potential is outputted from the test circuit 106 so that the potential of the connection terminal 116 is increased. Then, by increasing the potential of the connection terminal 116, the correction circuit 901 is operated, by which the potential at the time when the writing control signal has a High potential is supplied to the source line, so that the source line potential SL can be increased before the source line potential SL becomes lower than the gate line potential GL. Therefore, a High potential of the connection terminal 114 which is outputted when the source line potential SL becomes lower than the gate line potential GL is not detected. That is, the display device can maintain good display. Note that, since the potential of the connection terminal 116 is delayed as compared to one wavelength of an output waveform of the writing control signal SWE because the potential of the connection terminal 116 passes through the pixel portion and the test circuit, the potential of the writing control signal SWE can be held, thereby the correction circuit 901 can perform correction by using a High potential of the test circuit.

In FIG. 12, as the description made of the test circuit, when the signal outputted from the first circuit 111 in the test circuit 106 to the connection terminal 114 is a High potential, the source line potential SL is lower than the gate line potential GL. Further, the reference potential inputted to the second circuit 112 is denoted by the arrow 801 in FIG. 8 described in Embodiment Mode 1. In this case, when the gate line potential GL becomes lower than a potential which is obtained by subtracting a potential difference of the arrow 801 which is the threshold voltage (Vth) of the first transistor 201 from the source line potential SL, a High potential is outputted from the connection terminal 116.

Accordingly, with the output from the first circuit 111 to the connection terminal 114, which is the output of the test circuit 106, correction is constantly performed by the correction circuit 901 so that the source line potential SL does not become lower than the gate line potential GL, thereby good display can be performed. Further, the correction which is performed by the signal outputted from the third circuit 113 to the connection terminal 116 can be performed by the correction circuit incorporated in the display device. It is needless to say that, even in a display period of the display device, the signal which is obtained by subtracting the threshold voltage of the first transistor from the source line potential SL can be tested using a probe connected to a measuring instrument from the outside of the region sealed with the counter substrate, which is the advantageous effect described in Embodiment Mode 1. Note that the connection terminals 114, 115, and 116 may be provided together in the same portion as that of the connection terminals for inputting a video signal or a timing signal for performing display, or alternatively, may be provided at tips of wirings which are led to another portion.

Note that although a light-emitting element is given as an example of a display element in this embodiment mode, any display element of performing display in an active matrix display device which is operated by a gate line and a source line can be used. For example, a display medium whose contrast varies by an electromagnetic action can be used as a display element, such as an EL element (e.g., an organic EL element, an inorganic EL element, or an EL element containing an organic matter and an inorganic matter), an electron-emitting element, a liquid crystal element, electronic ink, a grating light valve (GLV), a plasma display panel (PDP), a digital micromirror device (DMD), a piezoceramic display device, or a carbon nanotube. Note that a display device using an EL element includes an EL display, a display device using an electron-emitting element includes a field emission display (FED), an SED flat-panel display (SED: Surface-conduction Electron-emitter Display), and the like, a display device using a liquid crystal element includes a liquid crystal display, and a display device using electronic ink includes electronic paper.

This embodiment mode can also be arbitrarily combined with another embodiment mode in this specification.

Embodiment Mode 3

This embodiment mode will describe a structure other than the above-described embodiment modes. Note that portions having the same functions as those in Embodiment Modes 1 and 2 are denoted by the same reference symbols, and the description in Embodiment Modes 1 and 2 is applied thereto.

Figure 13:
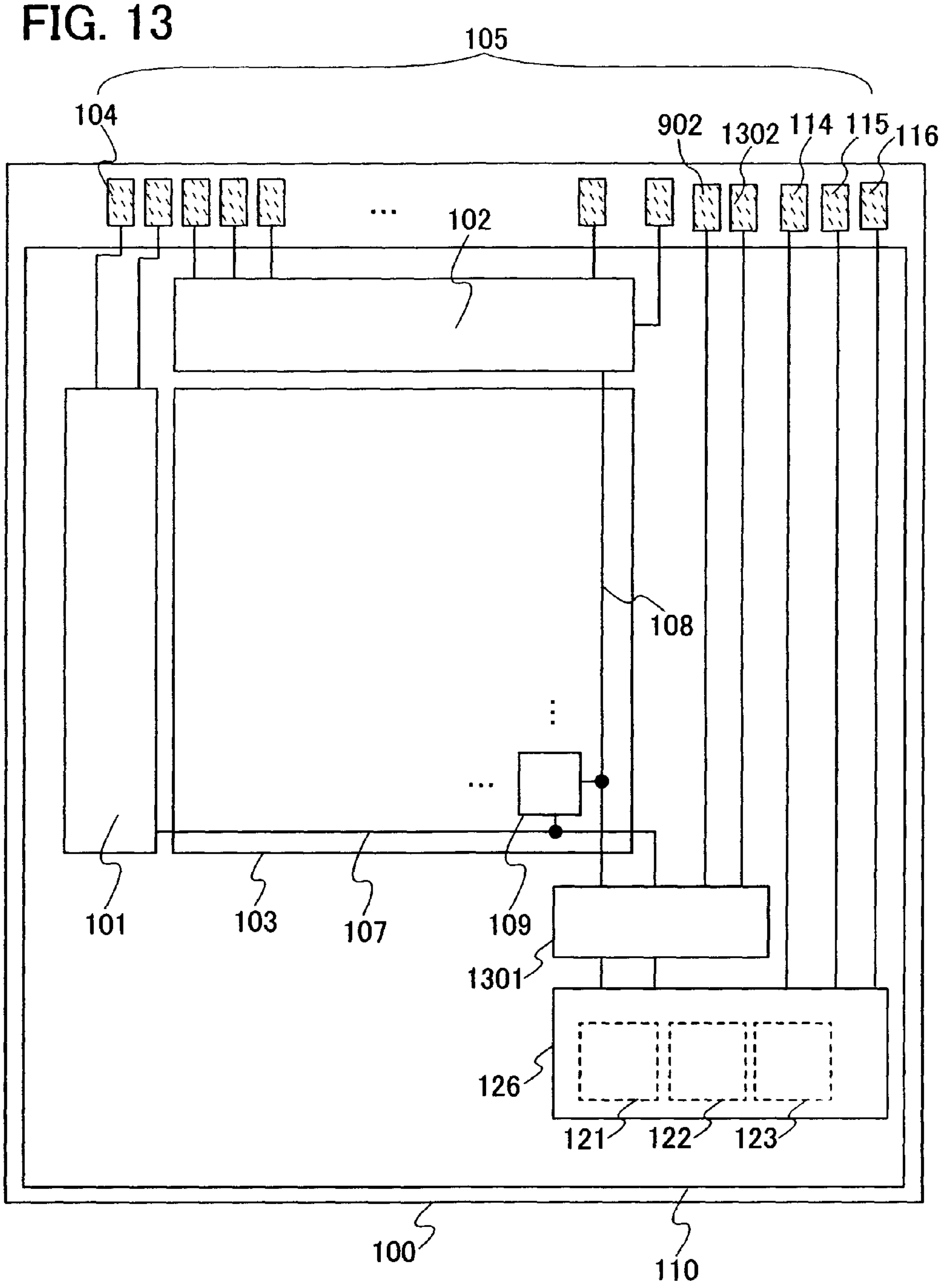
FIG. 13 is a block diagram of a structure of the present invention.

FIG. 13 is a block diagram of a display device in this embodiment mode, and detailed description will be made below. Note that a display device of the present invention means a device having a display element (e.g., a liquid crystal element or a light-emitting element). Further, the display device may mean a display panel itself in which a plurality of pixels including a display element such as a liquid crystal element or an EL element, and/or a peripheral driver circuit for driving the pixels are/is formed over a substrate. Further, the display device may include the display panel provided with a flexible printed circuit (FPC) or a printed wiring board (PWB). A light-emitting device means a display device having, particularly, a self-luminous type display element such as an EL element or an element used in an FED. A liquid-crystal display device means a display device having a liquid crystal element.

FIG. 13 shows a structure of this embodiment mode. A display device shown in FIG. 13 includes the gate signal line driver circuit 101, the source signal line driver circuit 102, the pixel portion 103, the connection terminal portion 105 in which the plurality of connection terminals 104 are formed, a test circuit 126, and a switching circuit 1301 over the substrate 100. The gate line 107 is connected to the gate signal line driver circuit 101 whereas the source line 108 is connected to the source signal line driver circuit 102. The pixel 109 in the pixel portion 103 is connected to the gate line 107 and the source line 108. In the pixel 109, the transistor for writing a signal from the source line 108 to a light-emitting element or a liquid crystal element provided in the pixel, by a signal from the gate line 107 is provided, and terminals of the transistor are connected to the gate line 107 and the source line 108 respectively. An FPC (Flexible Printed Circuit, which is not shown) for inputting an external signal is connected to the connection terminal portion 105. Then, the substrate 100 is completed as a display module by being attached the counter substrate 110 for sealing the light-emitting element or the liquid crystal element provided in the pixel 109.

The switching circuit 1301 is provided on the side opposite to a portion in which the gate line 107 is connected to the gate signal line driver circuit 101 whereas the source line 108 is connected to the source signal line driver circuit 102, and is connected to the gate line 107 and the source line 108. Note that a constant-potential signal inputted from a connection terminal 1302, and the signal SWEWE of controlling the writing control signal are inputted to the switching circuit 1301. Then, the switching circuit 1301 outputs the constant-potential signal from the connection terminal 1302 to the test circuit at the time of non-testing in the test circuit 126, whereas the switching circuit 1301 outputs a signal to the test circuit 126 by switching so as to output a potential of the gate line and a potential of the source line at the time when testing of the potentials of the gate line and the source line is performed in the test circuit 126.

Note that the writing control signal SWE (source write enable signal) in FIG. 13 is a signal for selecting writing or erasing of a signal of the source line. By inputting a High potential of the writing control signal SWE to the source signal line driver circuit, a High potential is written to the source line, whereas by inputting a Low potential of the writing control signal SWE to the source signal line driver circuit, a Low potential is written to the source line. The signal SWEWE of controlling the writing control signal in FIG. 13 is a signal for selecting supplying of the writing control signal to the source signal line driver circuit; by inputting a Low potential of the signal SWEWE of controlling the writing control signal to the switching circuit, the writing control signal SWE is supplied to the source signal line driver circuit.

The test circuit 126 is provided on the side opposite to a portion in which the gate line 107 is connected to the gate signal line driver circuit 101 whereas the source line 108 is connected to the source signal line driver circuit 102, and is connected to the gate line 107 and the source line 108. Note that the gate line 107 and the source line 108 connected to the test circuit through the switching circuit 1301 in FIG. 13 are one gate line and one source line connected to the pixels for performing display in the display device, which is different from Embodiment Modes 1 and 2. In this embodiment mode since more accurate evaluation of the pixels for performing display is performed by evaluating the potentials of the source line and the gate line connected to the pixels for performing display in the test circuit 126, testing can be performed more accurately than in Embodiment Modes 1 and 2.

The test circuit 126 detects a defect caused by the case where, in a relationship between the potentials of the gate line 107 and the source line 108 in the pixel portion which are outputted through the switching circuit 1301, the potential of the source line 108 is lower than the potential of the gate line 107 and the difference between a Low potential of the source line 108 and a Low potential of the gate line 107 is less than the threshold voltage (Vth) of the transistor for writing a signal from the source line 108. Specifically, in the test circuit 126, a first circuit 121 (also called a first comparison circuit) which compares the potential of the gate line 107 and the potential of the source line 108 and outputs a High potential when the potential of the source line 108 is lower than the potential of the gate line 107; a second circuit 122 (also called a subtraction circuit) which subtracts a reference potential from the potential of the source line 108 and outputs its result; and a third circuit 123 (also called a second comparison circuit) which compares the potential of the gate line 107 with the output of the second circuit 122 and outputs its result are provided. Then, the connection terminal 114 for outputting a result of the comparison in the first circuit 121, the connection terminal 115 for inputting the reference potential to the second circuit 122, and the connection terminal 116 for outputting a signal from the third circuit 123 are connected to the test circuit 126 from the connection terminal portion 105 by using a lead wiring. Note that the reference potential which is inputted to the second circuit 122 is preferably, in this specification, a potential almost equal to the threshold voltage (Vth) of the transistor for writing a signal from the source line, provided in the pixel; it is preferably about 0.1 to 2.0 V.

As for a pixel configuration of the pixel 109, the description of the examples shown in FIGS. 2 and 3 in Embodiment Mode 1 is applied thereto.

Figure 14:
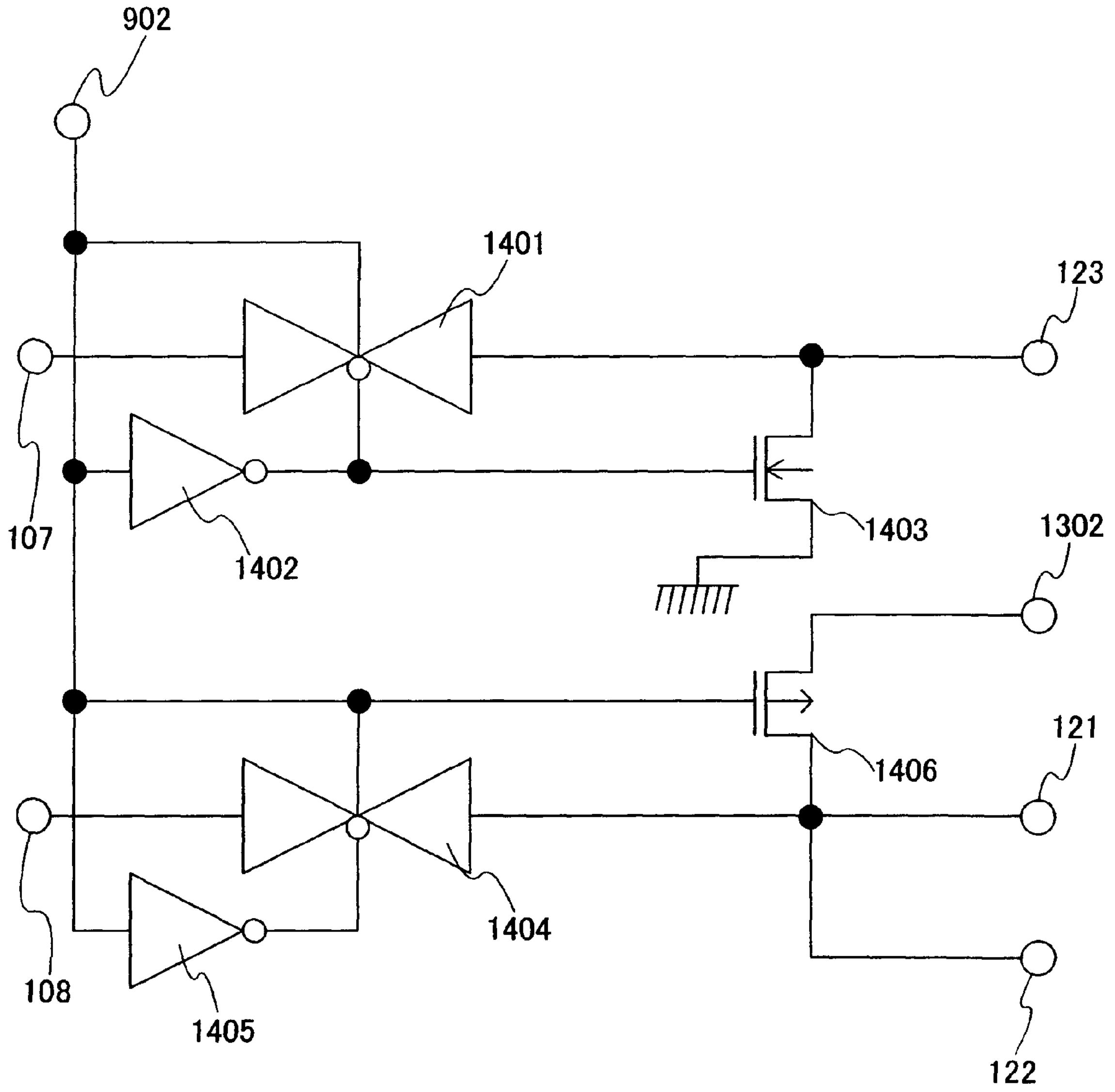
FIG. 14 is a circuit diagram of a switching circuit in a display device of the present invention.

Next, one structure of the switching circuit 1301 will be described using FIG. 14.

The switching circuit 1301 includes an analog switch 1401 and an inverter circuit 1402 for supplying the potential of the gate line 107 to the test circuit 126 when the signal SWEWE of controlling the writing control signal has a High potential, namely when a signal is not supplied to the source line 108. In addition, a transistor 1403 for supplying a potential to the test circuit 126 so as not to occur a malfunction of the test circuit 126 when the signal SWEWE of controlling the writing control signal has a Low potential, namely when the signal is supplied to the source line 108 is included. In addition, an analog switch 1404 and an inverter circuit 1405 for supplying the potential of the source line 108 to the test circuit 126 when the signal SWEWE of controlling the writing control signal has a High potential, namely when the signal is not supplied to the source line 108 are included. In addition, a transistor 1406 for supplying a potential to the test circuit 126 so as not to occur a malfunction of the test circuit 126 when the signal SWEWE of controlling the writing control signal has a Low potential, namely when the signal is supplied to the source line 108 is included.

Operations of the switching circuit 1301 will be briefly described. In the case where a High potential is inputted as the signal SWEWE of controlling the writing control signal from the connection terminal 902 to the switching circuit 1301, the switching circuit 1301 outputs the potentials of the gate line 107 and the source line 108 to the test circuit 126. On the other hand, in the case where a Low potential is inputted as the signal SWEWE of controlling the writing control signal from the connection terminal 902 to the switching circuit 1301, a GND potential is inputted to one of the test circuit 126 connected on the gate line 107 side whereas a potential higher than the GND potential is inputted to one of the test circuit 126 connected on the source line 108 side from the connection terminal 1302. This is because during a period in which the test circuit 126 is not connected to the gate line 107 and the source line 108, a defect in the potentials of the gate line 107 and the source line 108 is prevented from being judged by the potentials inputted to the test circuit 126; each of the potentials inputted to the test circuit 126 is not limited as long as a defect in the potentials of the gate line 107 and the source line 108 is not judged.

Note that if the test circuit 126 is directly connected to the gate line 107 and the source line 108 to perform testing, a current flows from the gate line 107 and the source line 108 to the test circuit 126 so that display has a defect, which is not good. In the present invention, a period of non-writing of the source line, during which the signal of controlling the writing control signal has a High potential, is focused on by the switching circuit to perform testing, thereby testing can be performed more accurately.

Figure 15:
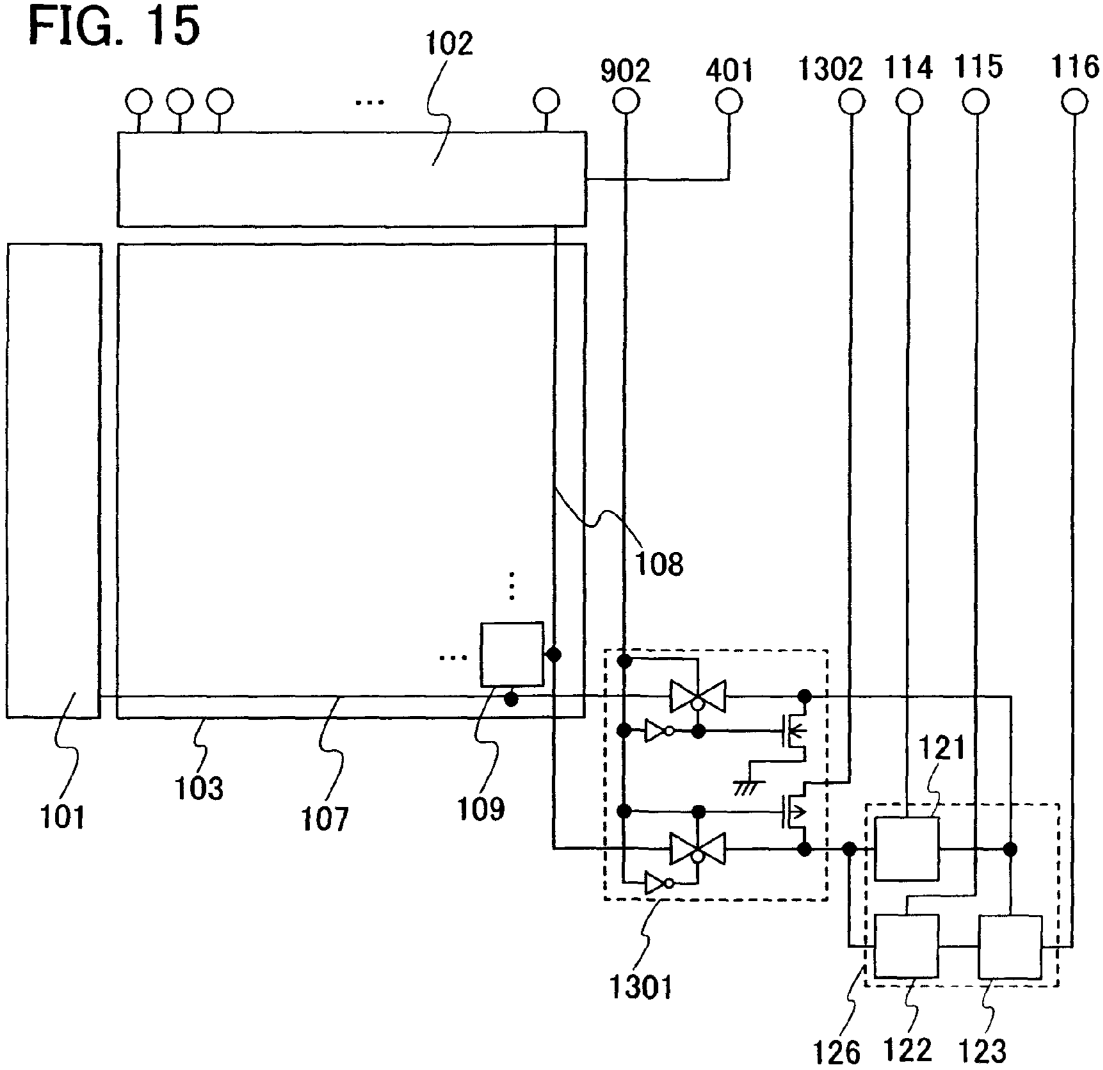
FIG. 15 is a block diagram of a structure of the present invention.

Next, FIG. 15 illustrates the case where a light-emitting element using an organic material for a light-emitting layer is adopted as a display medium of the present invention, in each pixel. Each pixel has the configuration shown in FIG. 2 in which the first transistor, the second transistor, the capacitor, and the light-emitting element are included. In FIG. 15 also, connections of the first circuit 121, the second circuit 122, and the third circuit 123 in the test circuit 126 shown in FIG. 13 are illustrated.

FIG. 15 shows the basic structure of the present invention in FIG. 1 in more detail. Note that in FIG. 15, the same portions as those in FIG. 1 are denoted by the same reference numerals, and description thereof is omitted. A display device shown in FIG. 15 includes the gate signal line driver circuit 101, the source signal line driver circuit 102, the pixel portion 103, the connection terminal portion (not shown) in which the plurality of connection terminals (not shown) are formed, and the test circuit 126 over the substrate (not shown). The gate line 107 is connected to the gate signal line driver circuit 101 whereas the source line 108 is connected to the source signal line driver circuit 102. Note that the writing control signal SWE is inputted to the source signal line driver circuit from the connection terminal 401. The pixel 109 in the pixel portion 103 is connected to the gate line 107 and the source line 108. In the pixel 109, the transistor for writing a signal from the source line 108 to a light-emitting element or a liquid crystal element provided in the pixel, by a signal from the gate line 107 is provided, and terminals of the transistor are connected to the gate line 107 and the source line 108 respectively. Then, the substrate is completed as a display module by being attached the counter substrate (not shown) for sealing the light-emitting element or the liquid crystal element provided in the pixel 109.

The test circuit 126 detects a defect caused by the case where, in a relationship between the potentials of the gate line 107 and the source line 108 in the pixel portion, the potential of the source line 108 is lower than the potential of the gate line 107 and lower than the threshold voltage (Vth) of the transistor for writing a signal from the source line 108. Specifically, in the test circuit 126, the first circuit 121 (also called the first comparison circuit) which compares the potential of the gate line 107 and the potential of the source line 108 and outputs a High potential when the potential of the source line 108 is lower than the potential of the gate line 107; the second circuit 122 (also called the subtraction circuit) which subtracts a reference potential from the potential of the source line 108 and outputs its result; and the third circuit 123 (also called the second comparison circuit) which compares the potential of the gate line 107 with the output of the second circuit 122 and outputs its result are provided. Then, the connection terminal 114 for outputting a result of the comparison in the first circuit 121, the connection terminal 115 for inputting the reference potential to the second circuit 122, and the connection terminal 116 for outputting a signal from the third circuit 123 are connected to the test circuit 126 from the connection terminal portion by using a lead wiring.

In the test circuit 126 in FIG. 15, the first circuit 121 is connected to the gate line 107, the source line 108, and the connection terminal 114. The second circuit 122 is connected to the source line 108, the connection terminal 115 for inputting the reference potential, and the third circuit 123. The third circuit 123 is connected to the second circuit 122, the gate line 107, and the connection terminal 116 for outputting a signal from the third circuit 123. Note that the reference potential which is inputted to the second circuit 122 is preferably, in this specification, a potential almost equal to the threshold voltage (Vth) of the first transistor 201 provided in the pixel; it is preferably about 0.1 to 2.0 V.

Figure 23:
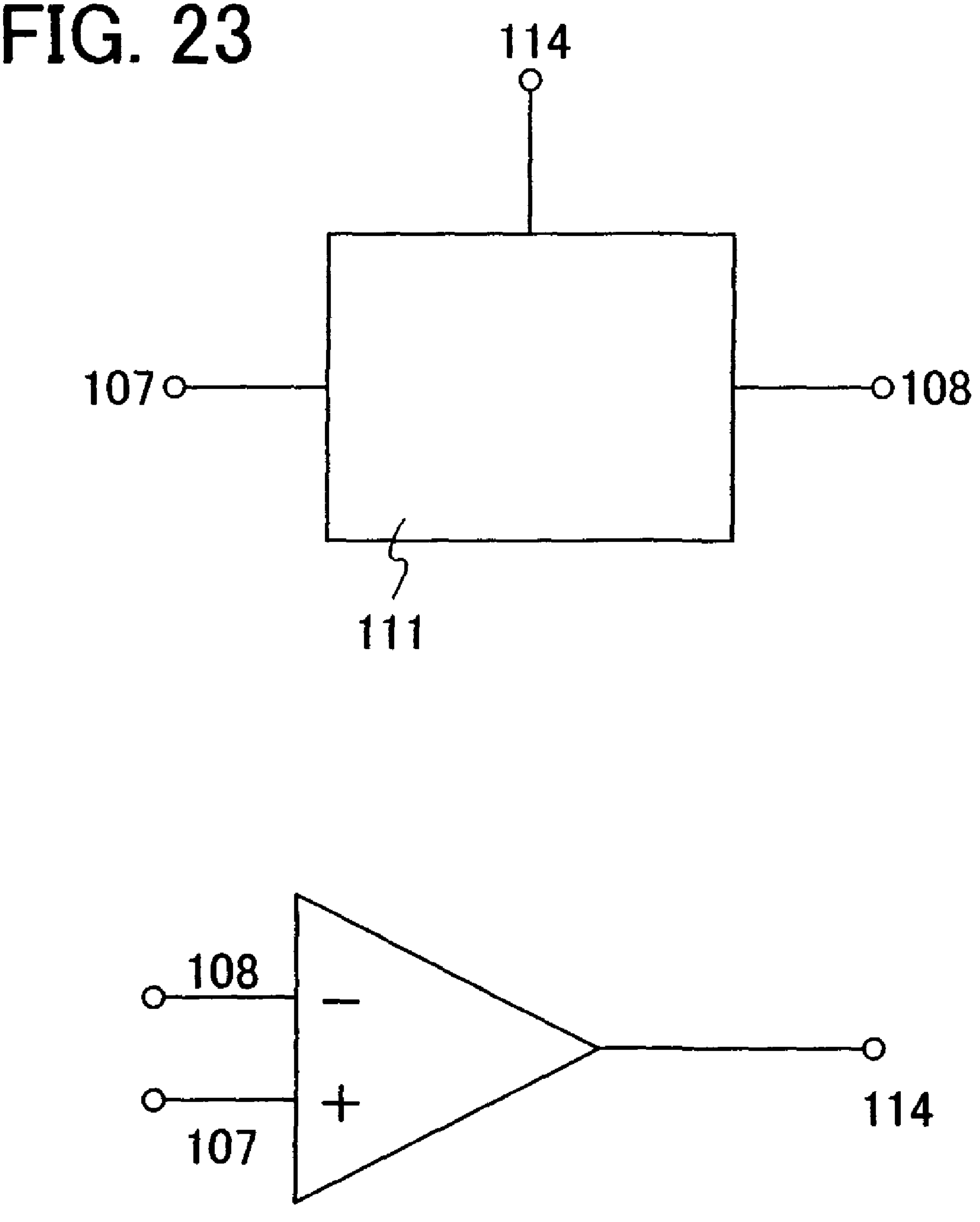
FIG. 23 is circuit diagrams of a test circuit of the present invention.
Figure 24:
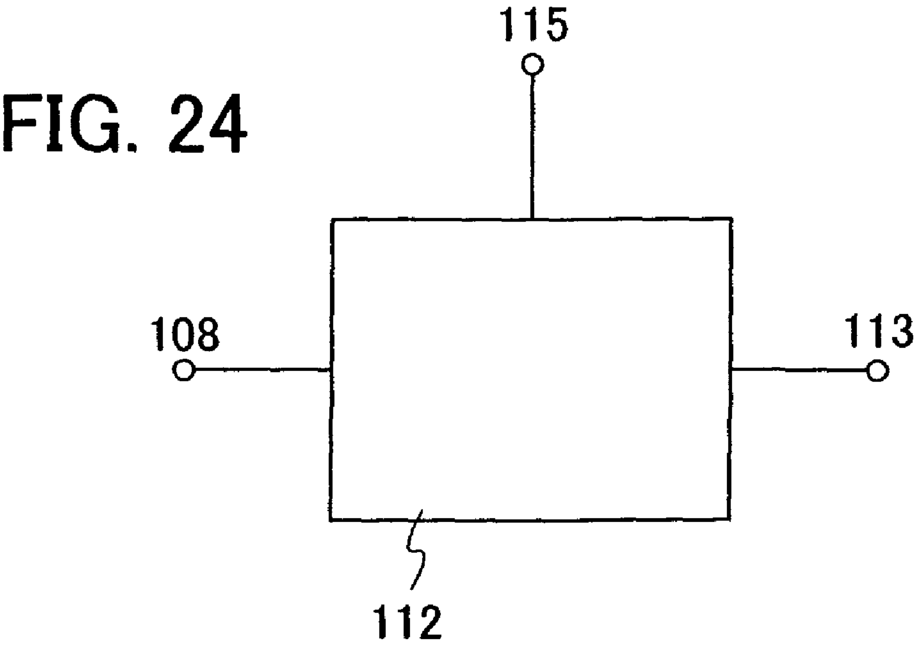
FIG. 24 is circuit diagrams of a test circuit of the present invention.
Figure 24:
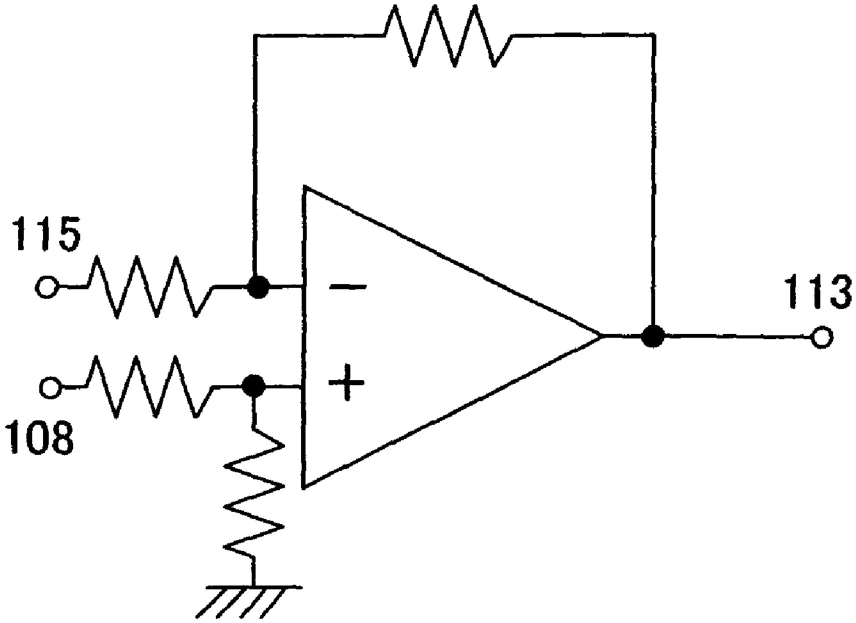
Figure 25:
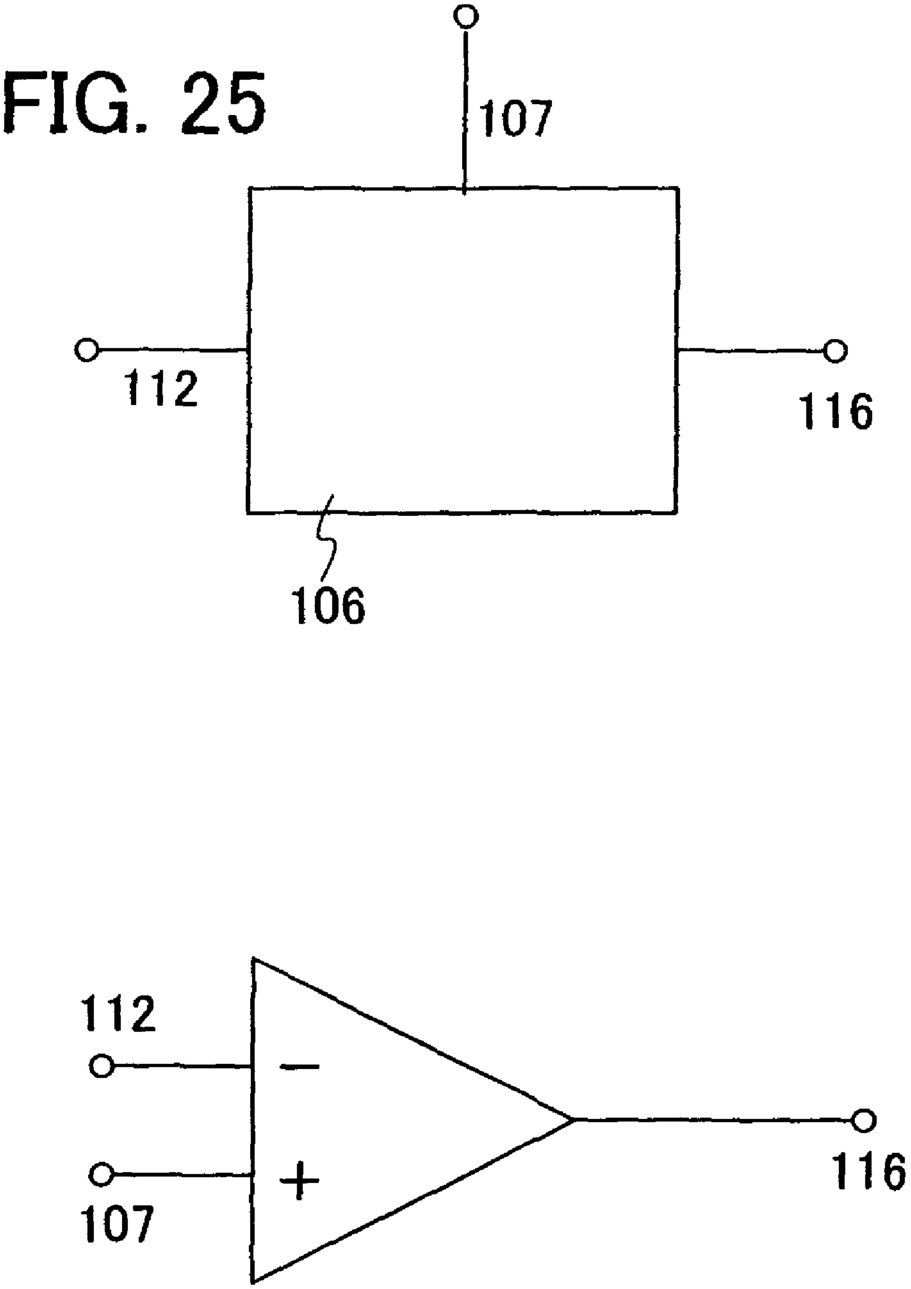
FIG. 25 is circuit diagrams of a test circuit of the present invention.

Next, FIGS. 23, 24, and 25 illustrate circuit structures and connections of the first circuit 121, the second circuit 122, and the third circuit 123 respectively.

A block diagram and a circuit diagram of the first circuit 121 in FIGS. 13 and 15 are shown in FIG. 23. The first circuit 121 is a comparison circuit for comparing the potential of the gate line 107 and the potential of the source line 108 with each other, in which the gate line 107 is connected to a non-inversion input terminal of an operational amplifier shown in FIG. 23 while the source line 108 is connected to an inversion input terminal thereof. By the first circuit 121, whether the potential of the source line 108 is lower than the potential of the gate line 107 or not can be detected. In the case where the potential of the source line 108 is lower than the potential of the gate line 107, a High potential is outputted from an output terminal of the operational amplifier to the connection terminal 114. Note that a negative power supply used as a power supply of the operational amplifier in the first circuit 121 is preferably a power supply having a potential lower by 2 V than a Low potential of the gate line 107.

Next, a block diagram and a circuit diagram of the second circuit 122 in FIGS. 13 and 15 are shown in FIG. 24. The second circuit 122 is formed of a subtraction circuit including an operational amplifier and resistors. In the second circuit 122, the potential of the source line 108 is connected to a non-inversion input terminal of the operational amplifier while the reference potential inputted to the connection terminal 115 is connected to an inversion input terminal thereof. The second circuit 122 outputs a potential which is obtained by subtracting the reference potential from the potential of the source line 108 to the third circuit 123. At this time, resistance of the resistors in the subtraction circuit in the second circuit 122 is preferably equal to one another. Further, the reference potential is preferably a potential almost equal to the threshold voltage (Vth) of the first transistor provided in the pixel; it is preferably about 0.1 to 2.0 V.

Next, a block diagram and a circuit diagram of the third circuit 123 in FIGS. 13 and 15 are shown in FIG. 25. The third circuit 123 is a comparison circuit including an operational amplifier, and compares the potential of the output of the second circuit 122 and the potential of the gate line 107 with each other. In the third circuit 123, the output of the second circuit 122 is connected to an inversion input terminal of the operational amplifier while the potential of the gate line 107 is connected to a non-inversion input terminal thereof. Then, the potential of the gate line 107 and the output potential of the second circuit 122 with each other, and in the case where the output potential of the second circuit 122 is lower than the potential of the gate line 107, a High potential is outputted from an output terminal of the operational amplifier to the connection terminal 116. In this manner, a verge just before the potential which is obtained by subtracting the threshold voltage (Vth) of the first transistor 201 from the potential of the source line 108 becomes lower than the potential of the gate line 107 can be detected.

Operations of the test circuit 126 are also similar to those of the test circuit 106 in Embodiment Mode 1, and thus the description using FIG. 8 in Embodiment Mode 1 is applied thereto here.

In accordance with this embodiment mode, a display device in which the test circuit 126 and the pixel portion 103 are provided over the same substrate and the test circuit and the pixel portion are sealed with the counter substrate 110 can be manufactured. In the display device of this embodiment mode, since the connection terminal 114 is provided outside the region sealed with the counter substrate, even in a display period of the display device, a signal outputted from the first circuit 121 to the connection terminal 114, which is an output of the test circuit 126, can be tested using a probe connected to a measuring instrument from the outside of the region sealed with the counter substrate, so that a defect of the display device can be detected. In addition, since the connection terminal 116 is provided outside the region sealed with the counter substrate, even in the display period of the display device, a signal outputted from the third circuit 123, which is obtained by subtracting the threshold voltage of the first transistor from the potential of the source line 108 can be tested using a probe connected to a measuring instrument from the outside of the region sealed with the counter substrate. In particular, in this embodiment mode, the potentials of the gate line and the source line for performing actual display are outputted to the test circuit while being switched by the switching circuit to perform testing, thereby testing can be performed in the display device more accurately. Note that the connection terminals 114, 115, and 116 may be provided together in the same portion as that of the connection terminals for inputting a video signal or a timing signal for performing display, or alternatively, may be provided at tips of wirings which are led to another portion.

This embodiment mode can also be arbitrarily combined with another embodiment mode in this specification.

Embodiment Mode 4

This embodiment mode will describe a structure other than the above-described embodiment modes. Note that portions having the same functions as those in Embodiment Modes 1 to 3 are denoted by the same reference symbols, and the description in Embodiment Modes 1 to 3 is applied thereto.

Figure 16:
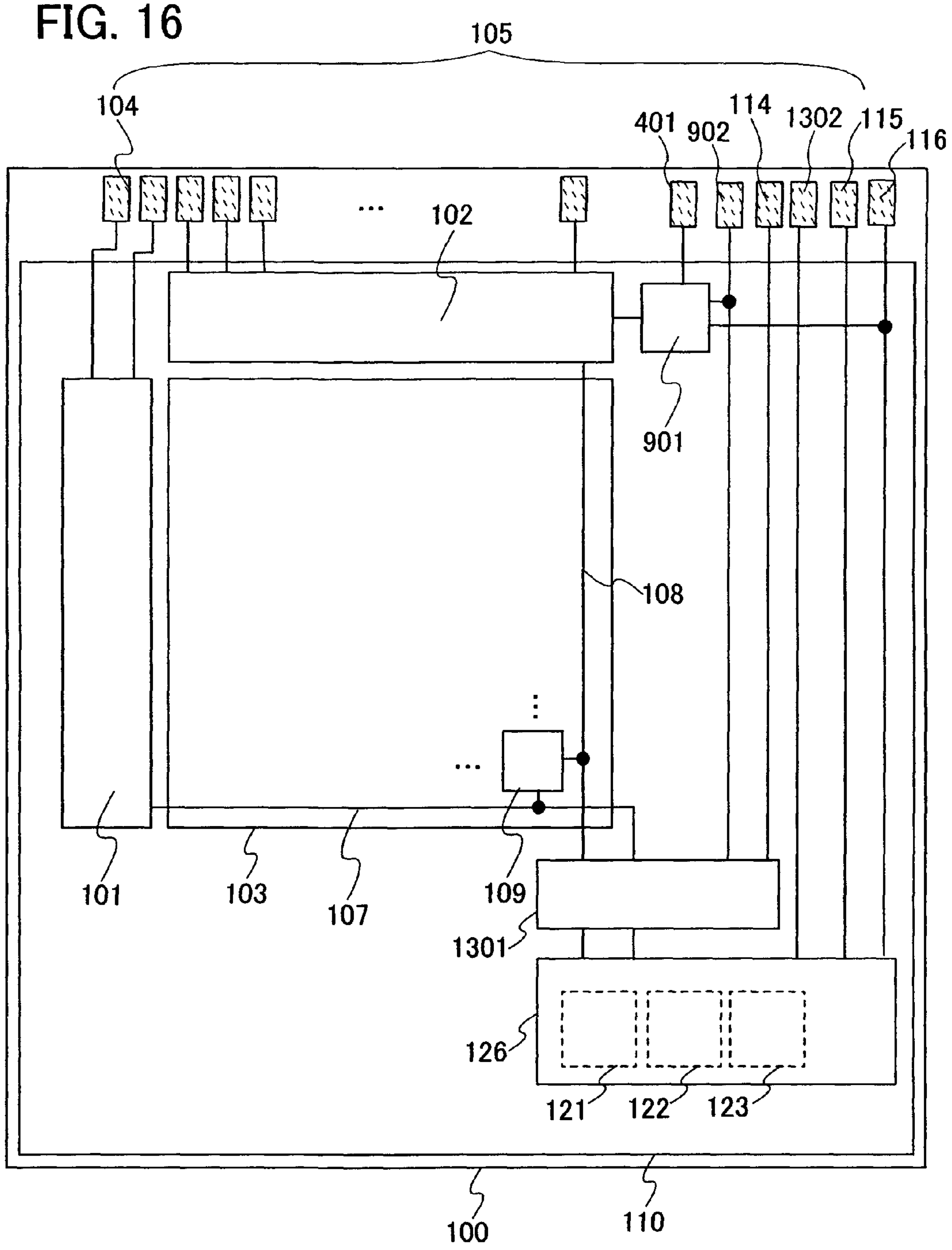
FIG. 16 is a block diagram of a structure of the present invention.

FIG. 16 is a block diagram of a display device in this embodiment mode, and detailed description will be made below. Note that a display device of the present invention means a device having a display element (e.g., a liquid crystal element or a light-emitting element). Further, the display device may mean a display panel itself in which a plurality of pixels including a display element such as a liquid crystal element or an EL element, and/or a peripheral driver circuit for driving the pixels are/is formed over a substrate. Further, the display device may include the display panel provided with a flexible printed circuit (FPC) or a printed wiring board (PWB). A light-emitting device means a display device having, particularly, a self-luminous type display element such as an EL element or an element used in an FED. A liquid-crystal display device means a display device having a liquid crystal element.

FIG. 16 shows a structure of this embodiment mode. A display device shown in FIG. 16 includes the gate signal line driver circuit 101, the source signal line driver circuit 102, the pixel portion 103, the connection terminal portion 105 in which the plurality of connection terminals 104 are formed, the test circuit 126, the correction circuit 901, and the switching circuit 1301 over the substrate 100. The gate line 107 is connected to the gate signal line driver circuit 101 whereas the source line 108 is connected to the source signal line driver circuit 102. The pixel 109 in the pixel portion 103 is connected to the gate line 107 and the source line 108. In the pixel 109, the transistor for writing a signal from the source line 108 to a light-emitting element or a liquid crystal element provided in the pixel, by a signal from the gate line 107 is provided, and terminals of the transistor are connected to the gate line 107 and the source line 108 respectively. An FPC (Flexible Printed Circuit, which is not shown) for inputting an external signal is connected to the connection terminal portion 105. Then, the substrate 100 is completed as a display module by being attached the counter substrate 110 for sealing the light-emitting element or the liquid crystal element provided in the pixel 109.

The switching circuit 1301 is provided on the side opposite to a portion in which the gate line 107 is connected to the gate signal line driver circuit 101 whereas the source line 108 is connected to the source signal line driver circuit 102, and is connected to the gate line 107 and the source line 108. Note that a constant-potential signal inputted from a connection terminal 1302, and the signal SWEWE of controlling the writing control signal are inputted to the switching circuit 1301. Then, the switching circuit 1301 outputs the constant-potential signal from the connection terminal 1302 at the time of non-testing in the test circuit 126, whereas the switching circuit 1301 outputs a signal to the test circuit 126 by switching so as to output a potential of the gate line and a potential of the source line at the time when testing of the potentials of the gate line and the source line is performed in the test circuit 126.

Note that the writing control signal SWE (source write enable signal) in FIG. 16 is a signal for selecting writing or erasing of a signal of the source line. By inputting a High potential of the writing control signal SWE to the source signal line driver circuit, a High potential is written to the source line, whereas by inputting a Low potential of the writing control signal SWE to the source signal line driver circuit, a Low potential is written to the source line. The signal SWEWE of controlling the writing control signal in FIG. 16 is a signal for selecting supplying of the writing control signal to the source signal line driver circuit; by inputting a Low potential of the signal SWEWE of controlling the writing control signal to the switching circuit, the writing control signal SWE is supplied to the source signal line driver circuit.

The test circuit 126 is provided on the side opposite to a portion in which the gate line 107 is connected to the gate signal line driver circuit 101 whereas the source line 108 is connected to the source signal line driver circuit 102, and is connected to the gate line 107 and the source line 108. Note that the gate line 107 and the source line 108 connected to the test circuit through the switching circuit 1301 in FIG. 16 are one gate line and one source line connected to the pixels for performing display in the display device, which is different from Embodiment Modes 1 and 2. In this embodiment mode since more accurate evaluation of the pixels for performing display is performed by evaluating the potentials of the source line and the gate line connected to the pixels for performing display in the test circuit 126, testing can be performed more accurately than in Embodiment Modes 1 and 2. Moreover, in this embodiment mode, correction of potential of the source line can be performed by the correction circuit 901.

The test circuit 126 detects a defect caused by the case where, in a relationship between the potentials of the gate line 107 and the source line 108 in the pixel portion, the potential of the source line 108 is lower than the potential of the gate line 107 and the difference between a Low potential of the source line 108 and a Low potential of the gate line 107 is less than the threshold voltage (Vth) of the transistor for writing a signal from the source line 108. Specifically, in the test circuit 126, the first circuit 121 (also called the first comparison circuit) which compares the potential of the gate line 107 and the potential of the source line 108 and outputs a High potential when the potential of the source line 108 is lower than the potential of the gate line 107; the second circuit 122 (also called the subtraction circuit) which subtracts a reference potential from the potential of the source line 108 and outputs its result; and the third circuit 123 (also called the second comparison circuit) which compares the potential of the gate line 107 with the output of the second circuit 122 and outputs its result are provided. Then, the connection terminal 114 for outputting a result of the comparison in the first circuit 121, the connection terminal 115 for inputting the reference potential to the second circuit 122, and the connection terminal 116 for outputting a signal from the third circuit 123 are connected to the test circuit 126 from the connection terminal portion 105 by using a lead wiring. Note that the reference potential which is inputted to the second circuit 122 is preferably, in this specification, a potential almost equal to the threshold voltage (Vth) of the transistor for writing a signal from the source line, provided in the pixel; it is preferably about 0.1 to 2.0 V.

In addition, the correction circuit 901 is connected to a wiring which is led from the test circuit 126 to the connection terminal 116, the connection terminal 401, and the connection terminal 902. The signal outputted from the third circuit 123 is inputted to the connection terminal 116 connected to the test circuit 126, the writing control signal SWE is inputted to the connection terminal 401, and the signal SWEWE of controlling the writing control signal is inputted to the connection terminal 902. Then, the writing control signal which is controlled by the correction circuit 901 is inputted to the source signal line driver circuit.

Note that the writing control signal SWE (source write enable signal) in FIG. 16 is a signal for selecting writing or erasing of a signal of the source line. By inputting a High potential of the writing control signal SWE to the source signal line driver circuit 102, a High potential is written to the source line, whereas by inputting a Low potential of the writing control signal SWE to the source signal line driver circuit 102, a Low potential is written to the source line. The signal SWEWE of controlling the writing control signal in FIG. 16 is a signal for selecting supplying of the writing control signal to the source signal line driver circuit; by inputting a Low potential of the signal SWEWE of controlling the writing control signal to the correction circuit, the writing control signal SWE is supplied to the source signal line driver circuit, whereas by inputting a High potential of the signal SWEWE of controlling the writing control signal to the correction circuit, whether output of the writing control signal SWE is supplied to the source signal line driver circuit or stopped is selected.

As for a pixel configuration of the pixel 109, the description of the examples shown in FIGS. 2 and 3 in Embodiment Mode 1 is applied thereto.

Figure 17:
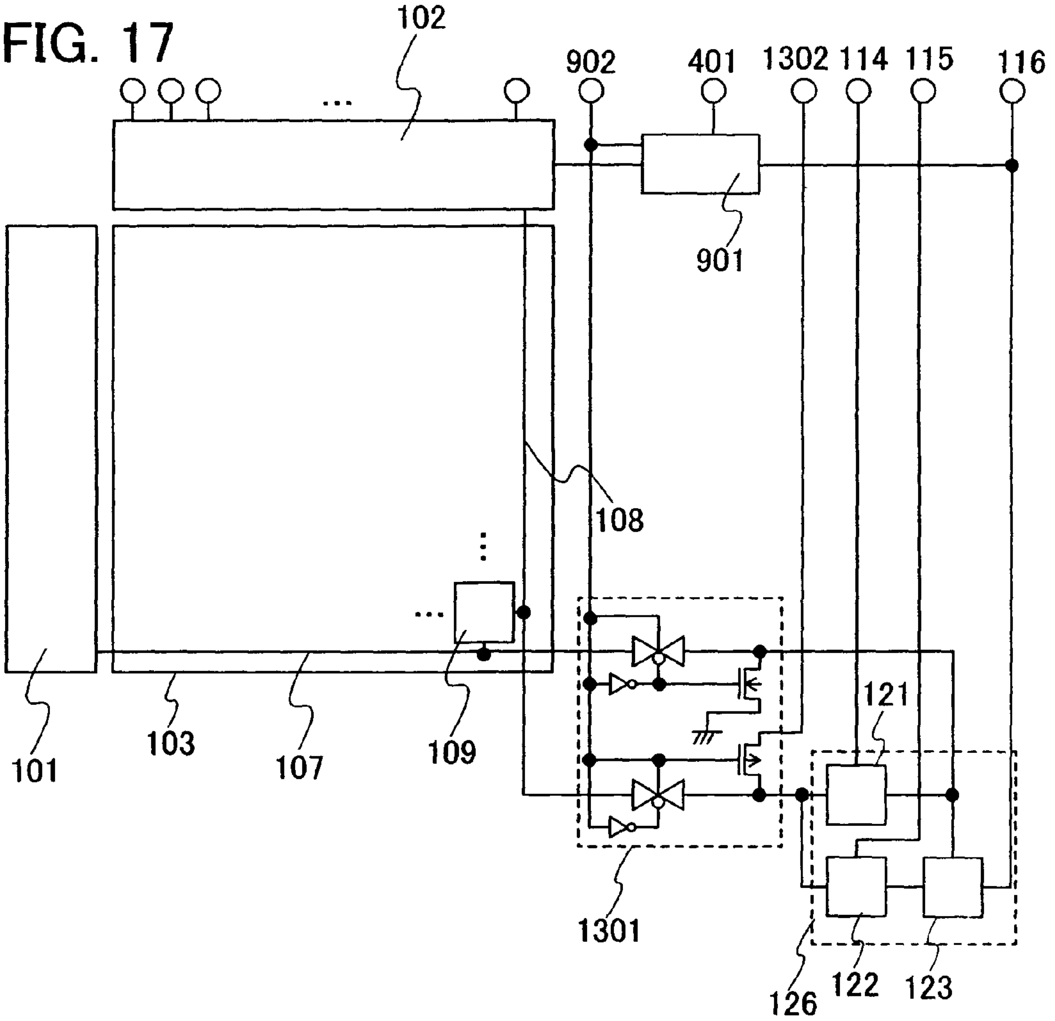
FIG. 17 is a block diagram of a structure of the present invention.

Next, FIG. 17 illustrates connections of the first circuit 121, the second circuit 122, and the third circuit 123 in the test circuit 126 shown in FIG. 16. Note that FIG. 17 illustrates the case where, similarly to the case in FIG. 4, a light-emitting element using an organic material for a light-emitting layer is adopted as a display medium in each pixel, having a configuration in which the first transistor, the second transistor, the capacitor, and the light-emitting element are included. Description in this embodiment mode will be made on the same case. As for circuit structures of the first circuit 121, the second circuit 122, and the third circuit 123, the description of the example shown in FIGS. 23, 24, and 25 in Embodiment Mode 3 is applied thereto. As the pixel configuration of the pixel 109, the configuration shown in FIG. 2 in which the first transistor, the second transistor, the capacitor, and the light-emitting element are included is adopted.

FIG. 17 shows the basic structure of the present invention in FIG. 16 in more detail. Note that in FIG. 17, the same portions as those in FIG. 16 are denoted by the same reference numerals, and description thereof is omitted. A display device shown in FIG. 17 includes the gate signal line driver circuit 101, the source signal line driver circuit 102, the pixel portion 103, the connection terminal portion (not shown) in which the plurality of connection terminals (not shown) are formed, the test circuit 126, the correction circuit 901, and the switching circuit 1301 over the substrate (not shown). The gate line 107 is connected to the gate signal line driver circuit 101 whereas the source line 108 is connected to the source signal line driver circuit 102. Note that the writing control signal SWE is inputted to the source signal line driver circuit from the connection terminal 401. The pixel 109 in the pixel portion 103 is connected to the gate line 107 and the source line 108. In the pixel 109, the transistor for writing a signal from the source line 108 to a light-emitting element or a liquid crystal element provided in the pixel, by a signal from the gate line 107 is provided, and terminals of the transistor are connected to the gate line 107 and the source line 108 respectively. Then, the substrate is completed as a display module by being attached the counter substrate (not shown) for sealing the light-emitting element or the liquid crystal element provided in the pixel 109.

Further, the test circuit 126 detects a defect caused by the case where, in a relationship between potentials of the gate line 107 and the source line 108, the potential of the source line 108 is lower than the potential of the gate line 107 and lower than the threshold voltage (Vth) of the first transistor 201. Specifically, in the test circuit 106, the first circuit 121 (also called the first comparison circuit) which compares the potential of the gate line 107 and the potential of the source line 108 and outputs a High potential when the potential of the source line 108 is lower than the potential of the gate line 107; the second circuit 122 (also called the subtraction circuit) which subtracts a reference potential from the potential of the source line 108 and outputs its result; and the third circuit 123 (also called the second comparison circuit) which compares the potential of the gate line 107 with the output of the second circuit 112 and outputs its result are provided. Then, the connection terminal 114 for outputting a result of the comparison in the first circuit 121, the connection terminal 115 for inputting the reference potential to the second circuit 122, and the connection terminal 116 for outputting a signal from the third circuit 123 are connected to the test circuit 126 from the connection terminal portion 105 by using a lead wiring.

In the test circuit 126 in FIG. 17, the first circuit 121 is connected to the gate line 107, the source line 108, and the connection terminal 114. The second circuit 122 is connected to the source line 108, the connection terminal 115 for inputting the reference potential, and the third circuit 123. The third circuit 123 is connected to the second circuit 122, the gate line 107, and the connection terminal 116 for outputting a signal from the third circuit 123. Note that the reference potential which is inputted to the second circuit 122 is preferably, in this specification, a potential almost equal to the threshold voltage (Vth) of the first transistor 201 provided in the pixel; it is preferably about 0.1 to 2.0 V.

In addition, the correction circuit 901 is connected to the wiring which is led from the test circuit 126 to the connection terminal 116, the connection terminal 401, and the connection terminal 902. The signal outputted from the third circuit 123 is inputted to the connection terminal 116 connected to the test circuit 126, the writing control signal SWE is inputted to the connection terminal 401, and the signal SWEWE of controlling the writing control signal is inputted to the connection terminal 902. Then, the writing control signal which is controlled by the correction circuit 901 is inputted to the source signal line driver circuit 102.

Note that the writing control signal SWE (source write enable signal) in FIG. 17 is a signal for selecting writing or erasing of a signal of the source line. By inputting a High potential of the writing control signal SWE to the source signal line driver circuit, a High potential is written to the source line, whereas by inputting a Low potential of the writing control signal SWE to the source signal line driver circuit, a Low potential is written to the source line. The signal SWEWE of controlling the writing control signal in FIG. 17 is a signal for selecting supplying of the writing control signal to the source signal line driver circuit; by inputting a Low potential of the signal SWEWE of controlling the writing control signal to the correction circuit, the writing control signal SWE is supplied to the source signal line driver circuit, whereas by inputting a High potential of the signal SWEWE of controlling the writing control signal to the correction circuit, whether output of the writing control signal SWE is supplied to the source signal line driver circuit or stopped is selected.

Note that in this embodiment mode, as for circuit structures of the first circuit 121, the second circuit 122, and the third circuit 123 in the test circuit 126, the description of the example shown in FIGS. 23, 24, and 25 in Embodiment Mode 3 is applied thereto. As for a circuit structure of the correction circuit 901, the description of the examples shown in FIGS. 11 and 22A to 22C is applied thereto. Further, operations of the test circuit 126 are also similar to those of the test circuit 106 in Embodiment Mode 1, and thus the description using FIG. 8 in Embodiment Mode 1 is applied thereto here. Further, operations of the correction circuit 901 are also similar to those in Embodiment Mode 2, and thus the description using FIG. 12 in Embodiment Mode 2 is applied thereto here.

Accordingly, with the output from the first circuit 121 to the connection terminal 114, which is the output of the test circuit 126, correction is constantly performed by the correction circuit 901 so that the source line potential SL does not become lower than the gate line potential GL, thereby good display can be performed. Further, the correction which is performed by the signal outputted from the third circuit 123 to the connection terminal 116 can be performed by the correction circuit 901 incorporated in the display device. It is needless to say that, even in a display period of the display device, the signal which is obtained by subtracting the threshold voltage of the first transistor from the source line potential SL can be tested using a probe connected to a measuring instrument from the outside of the region sealed with the counter substrate, which is the advantageous effect described in Embodiment Mode 1. In particular, in this embodiment mode, the potentials of the gate line and the source line for performing actual display are outputted to the test circuit 126 while being switched by the switching circuit to perform testing, thereby testing can be performed in the display device more accurately. Note that the connection terminals 114, 115, and 116 may be provided together in the same portion as that of the connection terminals for inputting a video signal or a timing signal for performing display, or alternatively, may be provided at tips of wirings which are led to another portion.

This embodiment mode can also be arbitrarily combined with another embodiment mode in this specification.

Embodiment 1

Figure 18A:
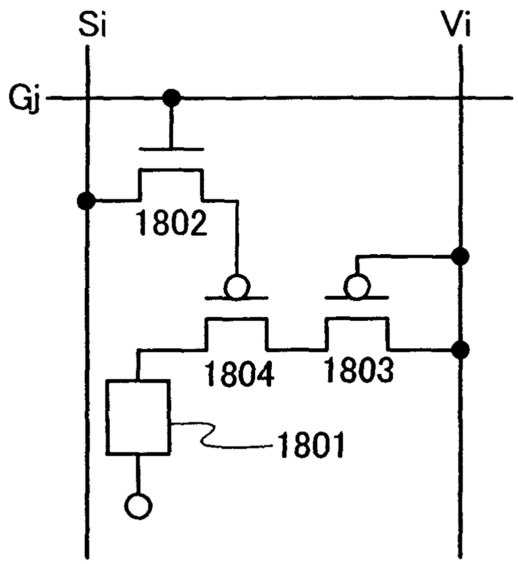
FIGS. 18A and 18B are circuit diagrams each showing a pixel configuration of the present invention.

The pixel configuration of the display device of the present invention is not limited to FIG. 2 in Embodiment Mode 1. One mode of the pixel of the display device of the present invention is shown in FIG. 18A. The pixel shown in FIG. 18A includes a light-emitting element 1801, a switching transistor 1802, a driving transistor 1803, and a current control transistor 1804 for selecting whether a current is supplied to the light-emitting element 1801 or not. Further, though not shown in FIG. 18A, a capacitor for holding a voltage of a video signal may be formed in the pixel.

The driving transistor 1803 and the current control transistor 1804 may have the same conductivity types or different conductivity types. The driving transistor 1803 is operated in the saturation region, while the current control transistor 1804 is operated in the linear region. Note that although the driving transistor 1803 is desirably operated in the saturation region, the present invention is not limited thereto; the driving transistor 1803 may be operated in the linear region. In addition, the switching transistor 1802 is operated in the linear region. The switching transistor 1802 may be either an n-channel transistor or a p-channel transistor.

When the driving transistor 1803 is a p-channel transistor as shown in FIG. 18A, it is preferable that an anode of the light-emitting element 1801 be a first electrode while a cathode thereof be a second electrode. On the other hand, when the driving transistor 1803 is an n-channel transistor, it is preferable that the cathode of the light-emitting element 1801 be the first electrode while the anode thereof be the second electrode.

A gate of the switching transistor 1802 is connected to a scanning line Gj (j=one of 1 to y). One of a source and a drain of the switching transistor 1802 is connected to a signal line Si (i=one of 1 to x) while the other is connected to a gate of the current control transistor 1804. A gate of the driving transistor 1803 is connected to a power supply line Vi (i=one of 1 to x). The driving transistor 1803 and the current control transistor 1804 are connected to the power supply line Vi and the light-emitting element 1801 so that a current supplied from the power supply line Vi is supplied to the light-emitting element 1801 as drain currents of the driving transistor 1803 and the current control transistor 1804. In this embodiment, a source of the driving transistor 1803 is connected to the power supply line Vi, and the current control transistor 1804 is provided between the driving transistor 1803 and the first electrode of the light-emitting element 1801.

In the case where the capacitor is formed, one of two electrodes of the capacitor is connected to the power supply line Vi while the other is connected to the gate of the current control transistor 1804. The capacitor is provided for holding a gate voltage of the current control transistor 1804.

Figure 18B:
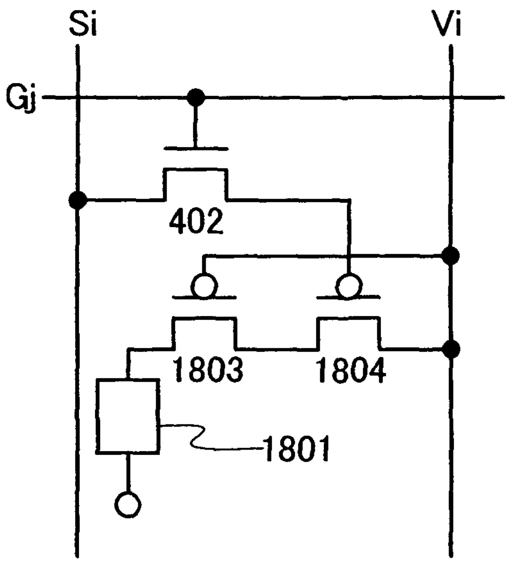

Note that the pixel configuration shown in FIG. 18A is only one mode of the present invention; the light-emitting device of the present invention is not limited to FIG. 18A. For example, as shown in FIG. 18B, a drain terminal of the driving transistor 1803 may be connected to the first electrode of the light-emitting element 1801, and the current control transistor 1804 may be provided between the driving transistor 1803 and the power supply line Vi. Note that the same portions as those in FIG. 18A are denoted by the same reference symbols in FIG. 18B.

This embodiment can also be arbitrarily combined with another embodiment mode or embodiment in this specification.

Embodiment 2

The display device of the present invention can improve an yield by testing for and correcting a display defect after being sealed with a counter substrate; therefore, it is optimum for a display portion of an electronic apparatus which is mass-produced such as a mobile phone, a portable game machine, an electronic book, or a camera such as a video camera or a digital still camera.

As other electronic apparatuses capable of using the display device of the present invention, there are a video camera, a digital camera, a goggle display (a head mounted display), a navigation system, an audio reproducing device (e.g., a car audio or an audio component), a laptop, a game machine, an image reproducing device provided with a recording medium (typically, a device for reproducing a recording medium such as a DVD (Digital Versatile Disc), provided with a display for displaying the reproduced image), and the like. Specific examples of such electronic apparatuses are shown in FIGS. 19A to 19C.

Figure 19A:
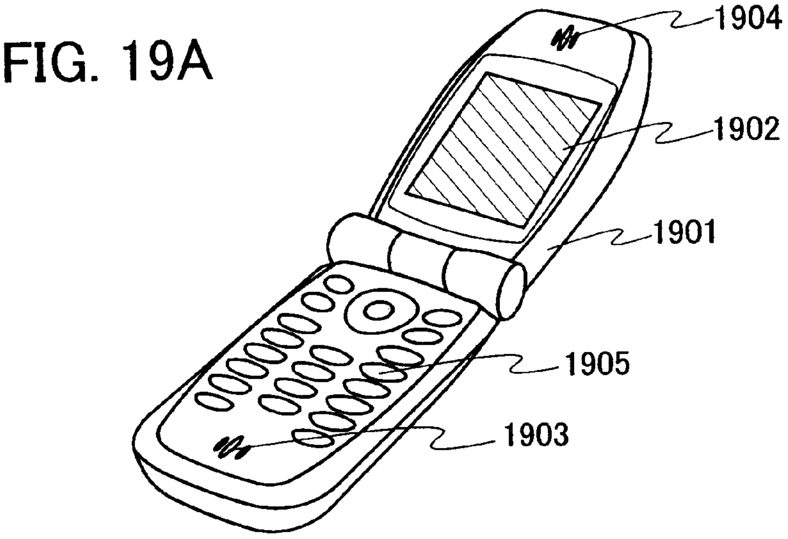
FIGS. 19A to 19C are diagrams each showing an electronic apparatus provided with a display device of the present invention.

FIG. 19A shows a mobile phone, which includes a main body 1901, a display portion 1902, an audio input portion 1903, an audio output portion 1904, operating keys 1905, and the like. By using the display device of the present invention for the display portion 1902, a mobile phone which is one electronic apparatus of the present invention can be completed.

Figure 19B:
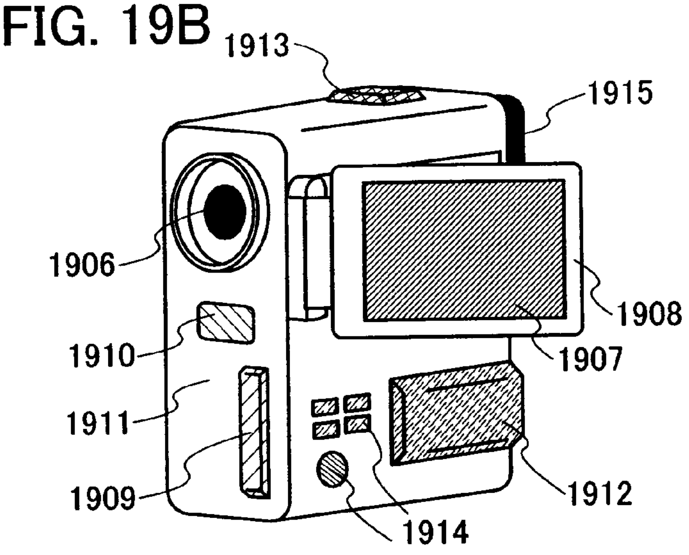

FIG. 19B shows a video camera, which includes a main body 1906, a display portion 1907, a housing 1908, an external connection port 1909, a remote control receiving portion 1910, an image receiving portion 1911, a battery 1912, an audio input portion 1913, operating keys 1914, an eyepiece portion 1915, and the like. By using the display device of the present invention for the display portion 1907, a video camera which is one electronic apparatus of the present invention can be completed.

Figure 19C:
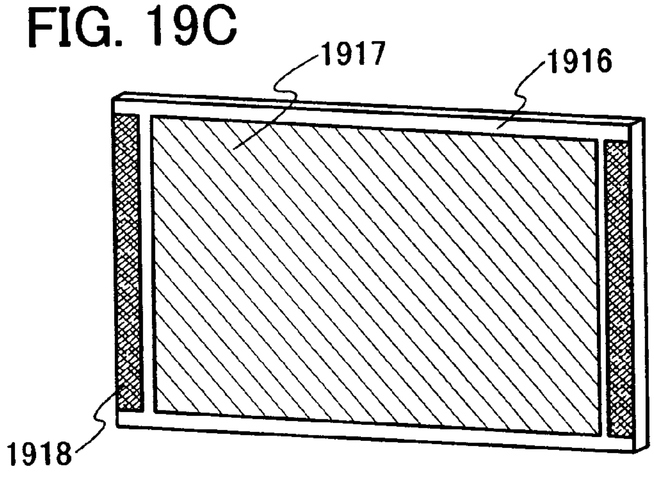
Figure 20:
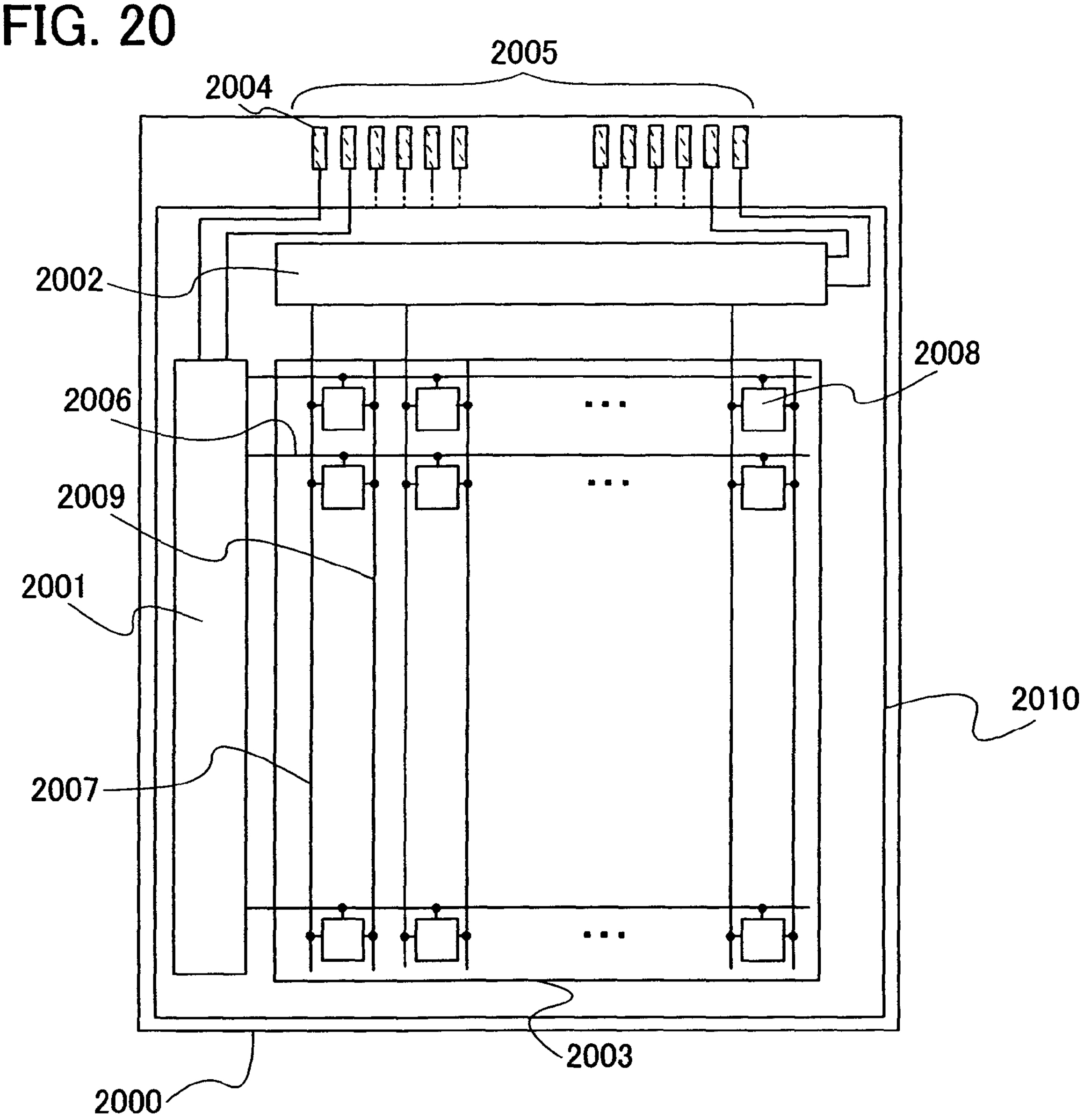
FIG. 20 is a block diagram illustrating a conventional example.
Figure 21A:
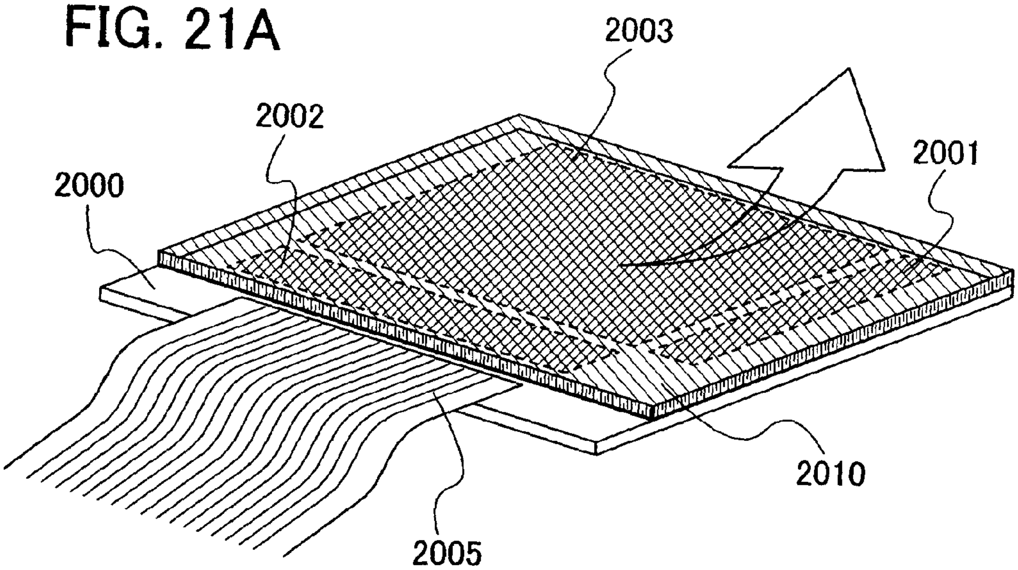
FIGS. 21A and 21B are illustrations in testing of a conventional example.
Figure 21B:
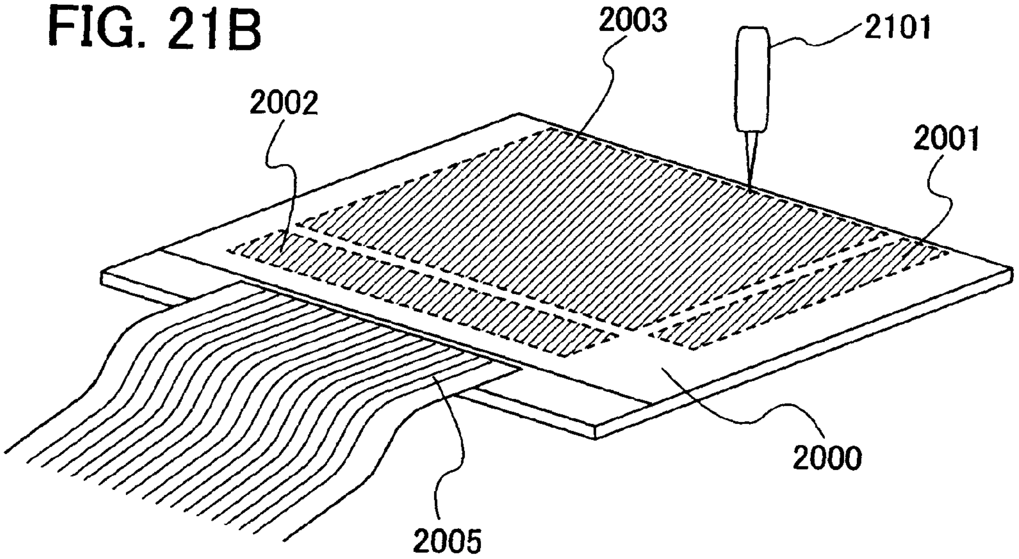

FIG. 19C shows a display, which includes a housing 1916, a display portion 1917, a speaker portion 1918, and the like.

By using the display device of the present invention for the display portion 1917, a display which is one electronic apparatus of the present invention can be completed. Note that the display includes all of information display devices for computer, TV broadcast reception, advertisement, and the like.

As set forth above, the applicable range of the present invention is so wide that the present invention can be used for electronic apparatuses of various fields.

This embodiment can also be arbitrarily combined with another embodiment mode or embodiment in this specification.

This application is based on Japanese Patent Application Ser. No. 2006-026761 filed in Japan Patent Office on 3rd, Feb. 2006, the entire contents of which are hereby incorporated by reference.

What is claimed is:

1. A display device comprising:

a gate line;

a source line;

a power source line;

a driver circuit for supplying a signal to the source line;

a pixel portion driven by potentials of the gate line and the source line;

a switching circuit connected to the gate line and the source line;

a test circuit; and a first connection terminal and a second connection terminal connected to the test circuit;

wherein the test circuit includes a first circuit connected to the gate line and the source line, a second circuit connected to the source line, and a third circuit connected to the gate line and the second circuit;

wherein the switching circuit connects the gate line and the source line to the test circuit when a signal for controlling writing of the source line is not supplied to the driver circuit;

wherein the first circuit compares an inputted potential of the gate line and an inputted potential of the source line and outputs a first potential to the first connection terminal when the inputted potential of the source line is lower than the inputted potential of the gate line;

wherein the second circuit inputs a second potential to the third circuit, which is obtained by subtracting a reference potential from an inputted potential of the source line; wherein the third circuit compares an inputted potential of the gate line and the second potential and outputs a third potential to the second connection terminal when the second potential is lower than the potential of the gate line;

wherein the pixel portion comprises a first transistor, a second transistor, and a light-emitting element;

wherein a gate of the first transistor is connected with the gate line, one of a source and a drain of the first transistor is connected with the source line, and the other of the source and the drain of the first transistor is connected with a gate of the second transistor; and wherein one of a source and a drain of the second transistor is connected with the light-emitting element and the other of the source and the drain of the second transistor is connected with the power source line.

2. A display device according to claim 1, wherein the first transistor is selected by a signal inputted to the gate line.

3. A display device according to claim 2, wherein the first transistor is an n-channel transistor.

4. A display device according to claim 1 wherein the display device is incorporated into one selected from the group consisting of a mobile phone and a video camera.

5. An electronic apparatus having the display device according to claim 1, in a display portion.

6. A display device comprising:

a gate line;

a source line;

a driver circuit for supplying a signal to the source line;

a pixel portion driven by potentials of the gate line and the source line;

a switching circuit connected to the gate line and the source line;

a test circuit; and a first connection terminal and a second connection terminal connected to the test circuit;

wherein the test circuit includes a first circuit connected to the gate line and the source line, a second circuit connected to the source line, and a third circuit connected to the gate line and the second circuit;

wherein the switching circuit connects the gate line and the source line to the test circuit when a signal for controlling writing of the source line is not supplied to the driver circuit;

wherein the first circuit compares an inputted potential of the gate line and an inputted potential of the source line and outputs a first potential to the first connection terminal when the inputted potential of the source line is lower than the inputted potential of the gate line;

wherein the second circuit inputs a second potential to the third, circuit, which is obtained by subtracting a reference potential from an inputted potential of the source line; and wherein the third circuit compares an inputted potential of the gate line and the second potential and outputs a third potential to the second connection terminal when the second potential is lower than the potential of the gate line.

7. A display device according to claim 6, wherein the first connection terminal and the second connection terminal are provided outside a region sealed by a substrate provided with the pixel portion and a counter substrate.

8. A display device according to claim 6, wherein the pixel portion has a transistor connected to the gate line and the source line, and the transistor is selected by a signal inputted to the gate line, and the signal from the source line is written.

9. A display device according to claim 8, wherein the transistor is an n-channel transistor.

10. A display device according to claim 6 wherein the display device is incorporated into one selected from the group consisting of a mobile phone and a video camera.

11. An electronic apparatus having the display device according to claim 6, in a display portion.

* * * * *